(12) United States Patent
Chan et al.

(10) Patent No.: US 8,626,084 B2
(45) Date of Patent: Jan. 7, 2014

(54) AREA EFFICIENT CONCURRENT MATCHING TRANSCEIVER

(75) Inventors: Ngar Loong A Chan, San Jose, CA (US); Jonghoon Choi, San Jose, CA (US); Bindu Gupta, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 336 days.

(21) Appl. No.: 12/970,210

(22) Filed: Dec. 16, 2010

(65) Prior Publication Data

US 2011/0279184 A1 Nov. 17, 2011

Related U.S. Application Data

(60) Provisional application No. 61/334,494, filed on May 13, 2010.

(51) Int. Cl.
*H04B 1/44* (2006.01)

(52) U.S. Cl.
USPC ............. 455/78; 455/333; 455/280; 323/284; 330/302; 330/129; 330/136; 342/372; 342/157; 342/173

(58) Field of Classification Search
USPC ........... 455/333, 280; 323/284; 330/302, 310, 330/254, 129, 136; 342/372, 157, 173
See application file for complete search history.

(56) References Cited

U.S. PATENT DOCUMENTS

| | | | |
|---|---|---|---|
| 5,697,069 A | 12/1997 | Bohm et al. | |
| 6,721,544 B1 | 4/2004 | Franca-Neto | |
| 6,784,837 B2 * | 8/2004 | Revankar et al. | 342/372 |
| 7,081,796 B2 * | 7/2006 | Krone | 330/254 |
| 7,209,727 B2 | 4/2007 | Castaneda et al. | |
| 7,936,237 B2 | 5/2011 | Park et al. | |
| 2002/0070720 A1 * | 6/2002 | L'Hermite et al. | 323/284 |
| 2004/0157579 A1 | 8/2004 | Namura | |
| 2005/0208917 A1 | 9/2005 | Roufoogaran et al. | |
| 2006/0046681 A1 * | 3/2006 | Bagheri et al. | 455/333 |
| 2006/0055470 A1 | 3/2006 | Luong et al. | |
| 2008/0207256 A1 | 8/2008 | Chan | |

(Continued)

FOREIGN PATENT DOCUMENTS

| | | |
|---|---|---|
| DE | 1020020084 A1 | 11/2006 |
| EP | 2037591 A2 | 3/2009 |

(Continued)

OTHER PUBLICATIONS

Adabi et al., "A mm-Wave Transformer Based Transmit/Receive Switch in 90nm CMOS Technology," European Microwave Conference, EuMC, Oct. 2009, pp. 389-392.

(Continued)

*Primary Examiner* — April G Gonzales

(74) *Attorney, Agent, or Firm* — William M. Hooks

(57) ABSTRACT

An integrated circuit for transmit and receive matching is described. The integrated circuit includes a transmit amplifier. The transmit amplifier includes a first transistor, a second transistor and a first inductor. The first inductor couples the first transistor to the second transistor. The integrated circuit also includes a low noise amplifier. The low noise amplifier includes a third transistor, a fourth transistor, the first inductor, a second inductor, a third inductor and a transformer. The second inductor couples the first inductor to the third transistor. The third inductor couples the third transistor to ground.

37 Claims, 21 Drawing Sheets

(56) References Cited

U.S. PATENT DOCUMENTS

| | | | |
|---|---|---|---|
| 2009/0017775 A1 | 1/2009 | Qiao et al. | |
| 2009/0029654 A1 | 1/2009 | Fu et al. | |
| 2009/0128244 A1* | 5/2009 | Deng et al. | 331/117 FE |
| 2010/0029227 A1 | 2/2010 | Narathong et al. | |
| 2011/0115572 A1 | 5/2011 | Chan | |
| 2012/0161879 A1* | 6/2012 | Leong et al. | 330/302 |
| 2012/0161880 A1* | 6/2012 | Sutardja et al. | 330/310 |

FOREIGN PATENT DOCUMENTS

| | | |
|---|---|---|
| GB | 2438751 A | 12/2007 |
| JP | S59147347 U | 10/1984 |
| JP | H04373317 A | 12/1992 |
| JP | H06224647 A | 8/1994 |
| JP | 9055681 A | 2/1997 |
| JP | H11205188 A | 7/1999 |
| JP | 2000278109 A | 10/2000 |
| JP | 2007028459 A | 2/2007 |
| JP | 2008072475 A | 3/2008 |
| JP | 2009013813 A | 1/2009 |
| WO | 2009009646 A2 | 1/2009 |

OTHER PUBLICATIONS

David Alldred et al., "A 1.2V, 60-GHz radio receiver with on-chip transformers and inductors in 90-nm CMOS", Compound Semiconductor Integrated Circuit Symposium, 2006, CSIC 2006, IEEE, IEEE, Piscataway NJ USA Nov. 1, 2006, pp. 51-54, XP031051648, ISBN: 978-1-4244-0126-0.
International Search Report and Written Opinion—PCT/US2011/036353, ISA/EPO—Sep. 22, 2011.
Jeon Kuhn, W.B.; "A UHF CMOS Transceiver Front-End With a Resonant TR Switch" Radio and Wireless Symposium, 2007 IEEE; Digital Object Identifier: 10.1109/RWS.2007.351760; Publication Year: 2007, pp. 71-74.
Razavi et al, "A UWB CMOS transceiver," IEEE Journal of Solid-State Circuits, Dec. 2005, pp. 2555-2562, Vol. 40, No. 12.
Zito D et al: "A Novel LNA Topology with Transformer-based Input Integrated Matching and its 60-GHz Millimeter-wave CMOS 65-nm Design", Electronics, Circuits and Systems, 2007. ICECS 2007. 14th IEEE International Conference on, IEEE, Piscataway, NJ, USA, Dec. 11, 2007, pp. 1340-1343, XP031248509, ISBN: 978-1-4244-1377-5.

* cited by examiner

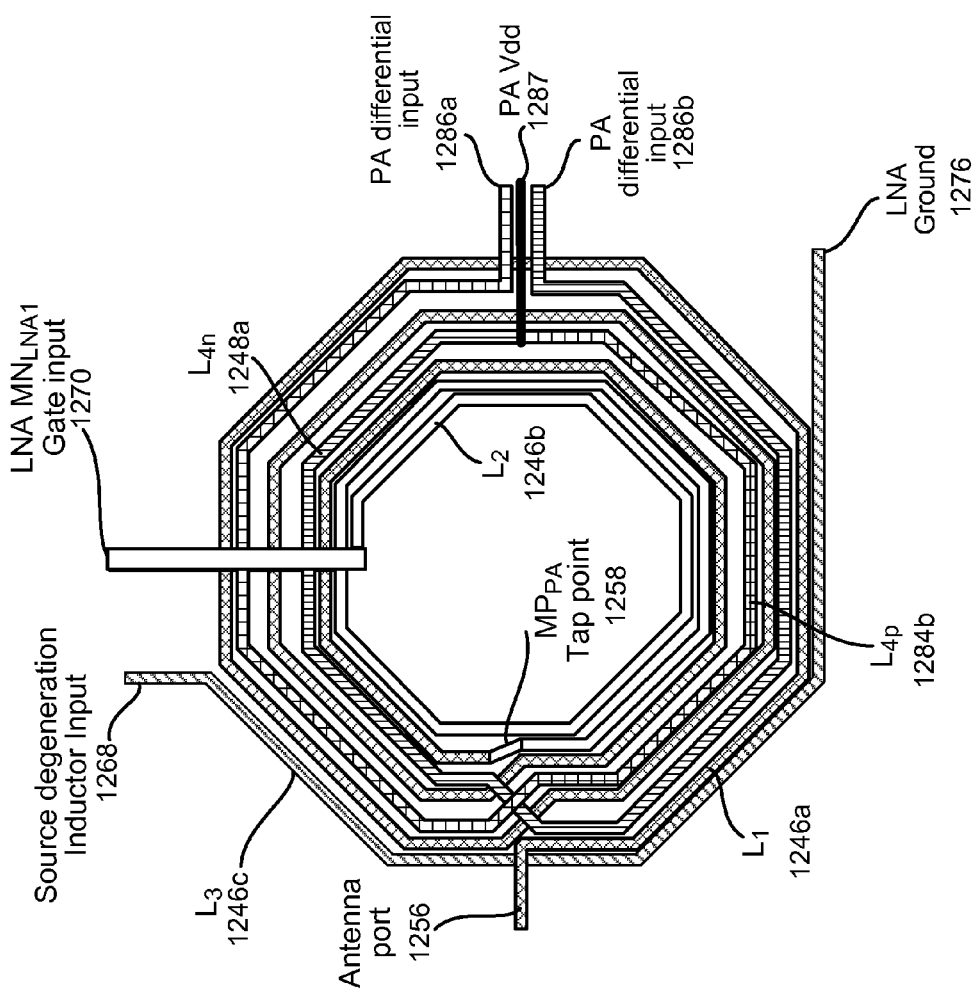

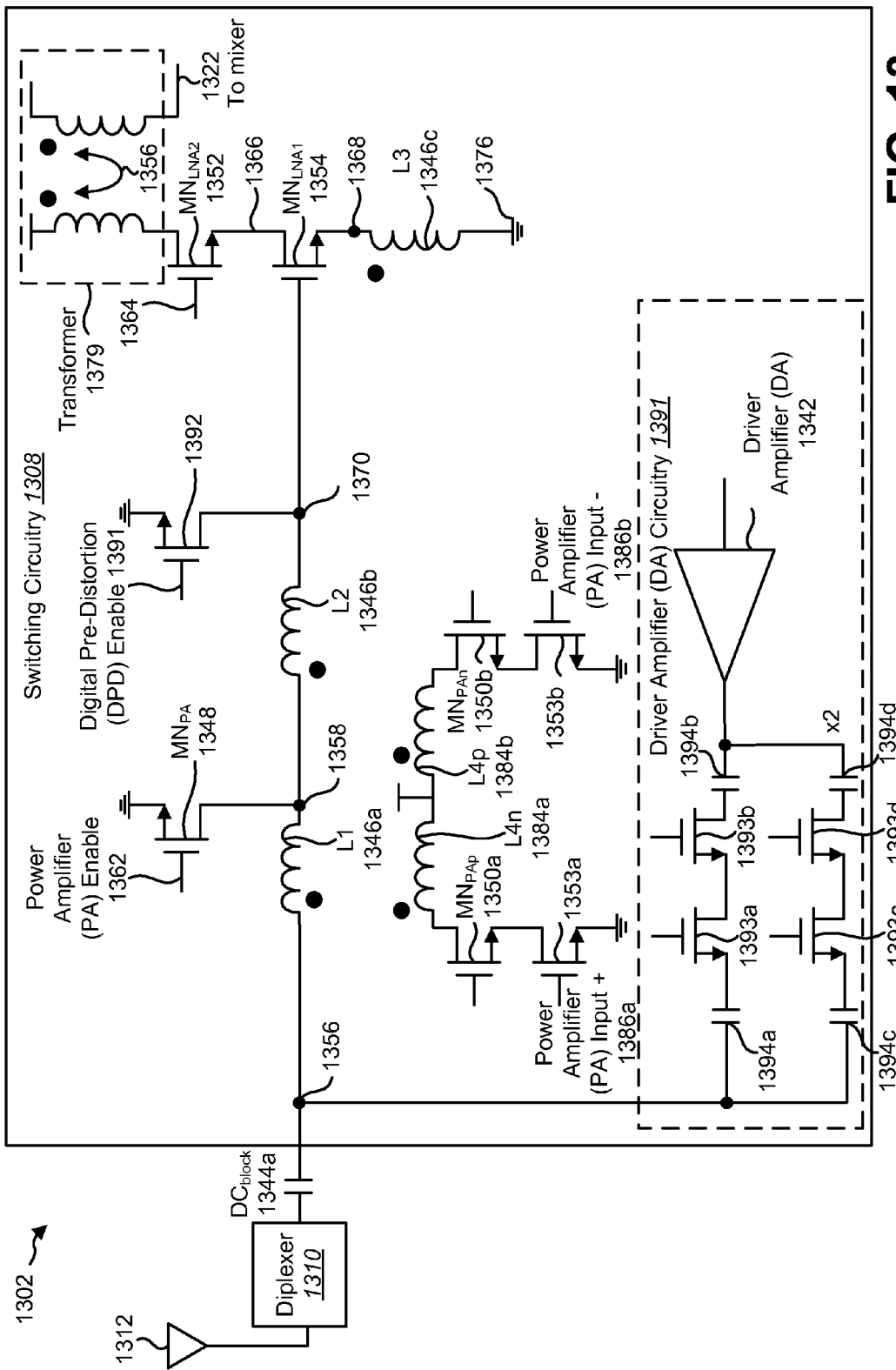

AREA EFFICIENT CONCURRENT MATCHING TRANSCEIVER

RELATED APPLICATIONS

This application is related to and claims priority from U.S. Provisional Patent Application Ser. No. 61/334,494, filed May 13, 2010, for "Concurrent Matching Transceiver Frontend with Impedance Transformation for High Power PA."

TECHNICAL FIELD

The present disclosure relates generally to wireless communication systems. More specifically, the present disclosure relates to systems and methods for an area efficient concurrent matching transceiver.

BACKGROUND

Wireless communication devices have become smaller and more powerful in order to meet consumer needs and to improve portability and convenience. Consumers have become dependent upon wireless communication devices such as cellular telephones, personal digital assistants (PDAs), laptop computers and the like. Consumers have come to expect reliable service, expanded areas of coverage, and increased functionality.

Wireless communication systems are widely deployed to provide various types of communication content such as voice, video, data, and so on. These systems may be multiple-access systems capable of supporting simultaneous communication of multiple terminals with one or more base stations.

A wireless communication device or a base station may include one or more integrated circuits. These integrated circuits may include analog and digital circuitry necessary for wireless communication. Such circuitry may include inductors and transformers. To save space and power in a wireless device, matching circuitry may be switched from discrete components to integrated circuit components. Benefits may be realized by moving the matching circuitry onto integrated circuits.

SUMMARY

An integrated circuit for transmit and receive matching is described. The integrated circuit includes a transmit amplifier. The transmit amplifier includes a first transistor, a second transistor and a first inductor. The first inductor couples the first transistor to the second transistor. The integrated circuit also includes a low noise amplifier. The low noise amplifier includes a third transistor, a fourth transistor, the first inductor and a second inductor that couples the first inductor to the third transistor. The low noise amplifier also includes a third inductor that couples the third transistor to ground. The low noise amplifier further includes a transformer.

The transmit amplifier may be a driver amplifier. The first transistor may be an n-type transistor. The second transistor may be a p-type transistor. A driver amplifier input may be coupled to a gate of the first transistor. The first transistor may be a p-type transistor and the second transistor may be an n-type transistor. A driver amplifier input may then be coupled to a gate of the first transistor.

A drain of the first transistor may be coupled to a first node. The first inductor may be coupled between the first node and a second node. A source of the second transistor may be coupled to the second node. The third transistor may be an n-type transistor. The fourth transistor may be an n-type transistor. The third inductor may be coupled to a source of the third transistor. A drain of the third transistor may be coupled to a source of the fourth transistor. A drain of the fourth transistor may be coupled to the transformer.

The first transistor and the second transistor may be turned off during receive mode. The third transistor and the fourth transistor may be turned off during transmit mode. A magnetic coupling may occur between the first inductor, the second inductor and the third inductor. The first inductor, the second inductor and the third inductor may be part of combined matching circuitry. The integrated circuit may also include a $2^{nd}$ harmonic trap.

The transmit amplifier may be a power amplifier. The transmit amplifier may include a fourth inductor coupled to the first transistor. The coupling between the first transistor and the second transistor may be a magnetic coupling between the first inductor and the fourth inductor. The first inductor may be coupled to a first node and the first node may be coupled to a diplexer.

The integrated circuit may also include a first direct current blocking capacitor coupled between the first node and the diplexer. The integrated circuit may further include a second direct current blocking capacitor coupled between the third inductor and a gate of the third transistor. The integrated circuit may also include a fifth inductor and a fifth transistor. The first inductor and the fifth inductor may form a magnetic coupling between the fifth transistor and the second transistor.

A gate of the first transistor may be coupled to a first differential power amplifier input. A gate of the fifth transistor may be coupled to a second differential power amplifier input. The integrated circuit may also include a capacitor and a sixth transistor. The capacitor may be coupled between the first inductor and the sixth transistor.

The first inductor may be coupled to a first node. The first node may be coupled to a diplexer. The transmit amplifier may include a sixth transistor and a seventh transistor. The sixth transistor may be coupled between the first transistor and the fourth inductor to form a first cascode device. The seventh transistor may be coupled between the fifth transistor and the fifth inductor to form a second cascode device. The integrated circuit may also include a driver amplifier circuitry coupled to the first node. The driver amplifier circuitry may include a driver amplifier and circuitry to switch a coupling between the driver amplifier and the first node on and off.

The circuitry to switch the coupling between the driver amplifier and the first node may be on during a low power transmit mode and off otherwise. During a high power transmit mode the driver amplifier circuitry, the third transistor and the fourth transistor may be turned off. The first transistor, the second transistor and the sixth transistor may be turned on during a high power transmit mode.

A method for switching between transmit mode and receive mode on an integrated circuit is described. The method includes switching to operating in transmit mode. Transmit amplifier devices are turned on. The transmit amplifier devices include a first transistor and a second transistor. A first inductor couples the first transistor to the second transistor. Low noise amplifier devices are turned off. The low noise amplifier devices include a third transistor. A second inductor couples the first inductor to the third transistor. A third inductor couples the third transistor to ground. The low noise amplifier devices also include a fourth transistor. A transformer couples the fourth transistor to a mixer.

Transmit signals are sent to a diplexer. The method further includes switching to operating in receive mode. The low noise amplifier devices are turned on. The transmit amplifier devices are turned off. Signals are received from the diplexer. A driver amplifier circuitry may be turned on.

An apparatus for switching between transmit mode and receive mode is described. The apparatus includes means for switching to operating in transmit mode. The apparatus also includes means for turning on transmit amplifier devices. The transmit amplifier devices include a first transistor and a second transistor. A first inductor couples the first transistor to the second transistor. The apparatus further includes means for turning off low noise amplifier devices. The low noise amplifier devices include a third transistor. A second inductor couples the first inductor to the third transistor. A third inductor couples the third transistor to ground. The low noise amplifier devices also include a fourth transistor. A transformer couples the fourth transistor to a mixer.

The apparatus also includes means for sending transmit signals to a diplexer. The apparatus further includes means for switching to operating in receive mode. The apparatus also includes means for turning on the low noise amplifier devices. The apparatus further includes means for turning off the transmit amplifier devices. The apparatus also includes means for receiving signals from the diplexer.

A computer-program product for a wireless device configured for switching between transmit mode and receive mode is also described. The computer-program product includes a non-transitory computer-readable medium having instructions thereon. The instructions include code for causing a wireless device to switch to operating in transmit mode. The instructions also include code for causing the wireless device to turn on transmit amplifier devices. The transmit amplifier devices include a first transistor and a second transistor. A first inductor couples the first transistor to the second transistor.

The instructions also include code for causing the wireless device to turn off low noise amplifier devices. The low noise amplifier devices include a third transistor. A second inductor couples the first inductor to the third transistor. A third inductor couples the third transistor to ground. The low noise amplifier devices also include a fourth transistor. A transformer couples the fourth transistor to a mixer.

The instructions further include code for causing the wireless device to send transmit signals to a diplexer. The instructions also include code for causing the wireless device to switch to operating in receive mode. The instructions further include code for causing the wireless device to turn on the low noise amplifier devices. The instructions also include code for causing the wireless device to turn off the transmit amplifier devices. The instructions further include code for causing the wireless device to receive signals from the diplexer.

BRIEF DESCRIPTION OF THE DRAWINGS

FIG. 12 is a layout example illustrating another possible layout of the first inductor L1, the second inductor L2, the third inductor L3 and the fourth inductor L4n and L4p;

FIG. 13 is a circuit diagram illustrating a wireless device with switching circuitry including a cascode differential power amplifier (PA) for higher transmit power and a driver amplifier (DA) for lower transmit power;

DETAILED DESCRIPTION

Figure 1:
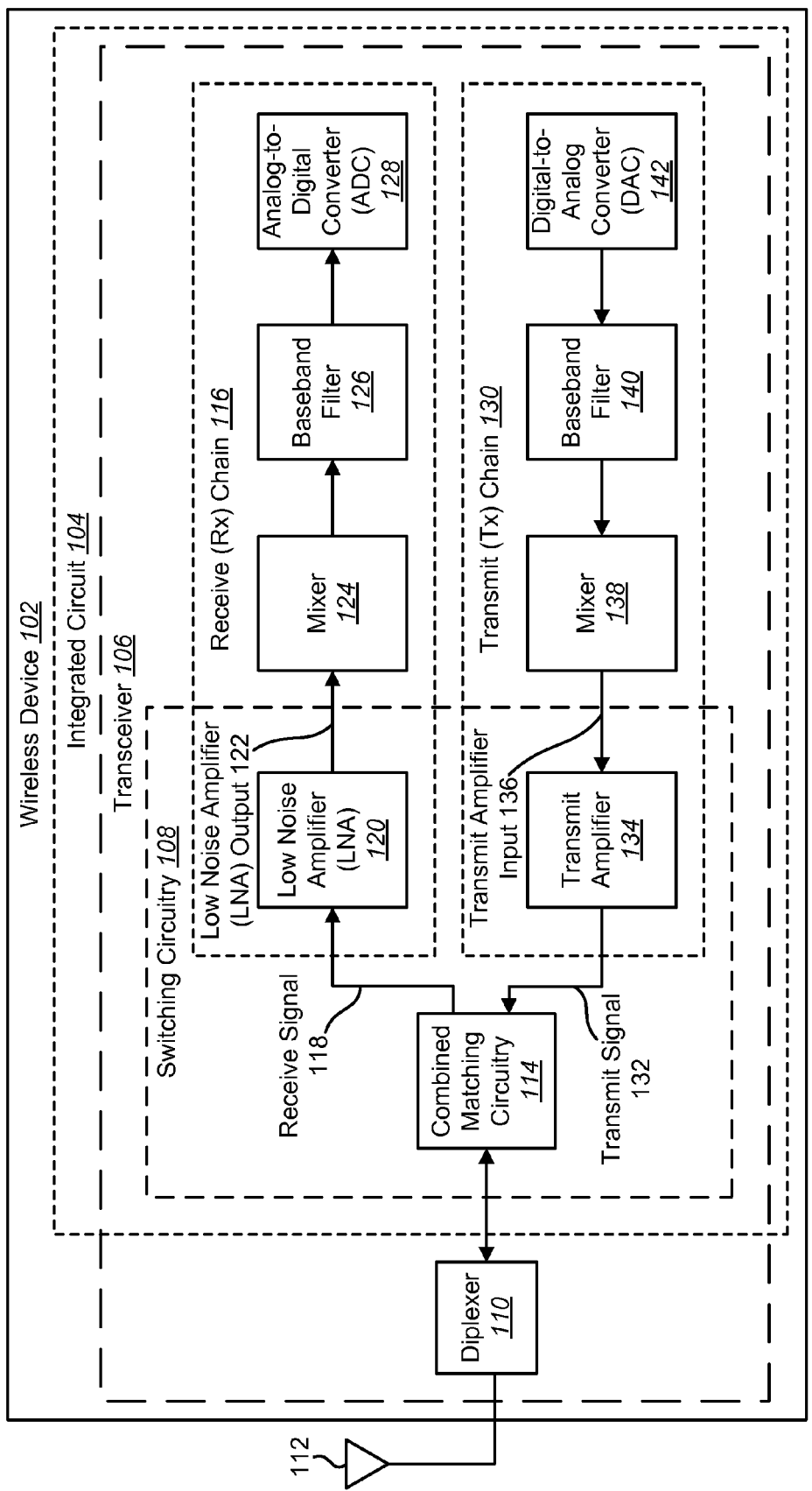
FIG. 1 shows a wireless device for use in the present systems and methods.

FIG. 1 shows a wireless device 102 for use in the present systems and methods. A wireless device 102 may be a base station, a wireless communication device, a controller, or the like. A base station is a station that communicates with one or more wireless communication devices. A base station may also be referred to as, and may include some or all of the functionality of, an access point, a broadcast transmitter, a Node B, an evolved Node B, etc. The term "Base Station" will be used herein. Each base station provides communication coverage for a particular geographic area. A base station may provide communication coverage for one or more wireless communication devices. The term "cell" can refer to a base station and/or its coverage area depending on the context in which the term is used.

A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, etc. A wireless communication device may communicate with zero, one, or multiple base stations on the downlink and/or uplink at any given moment. The downlink (or forward link) refers to the communication link from a base station to a wireless communication device, and the uplink (or reverse link) refers to the communication link from a wireless communication device to a base station.

Base stations and wireless communication devices may communicate with each other in a wireless communication system. Wireless communication systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, orthogonal frequency division multiple access (OFDMA) systems, spatial division multiple access (SDMA) systems, wireless local area network (WLAN) systems and Bluetooth systems.

A wireless device 102 may make use of time division duplex (TDD). In TDD, signals may be transmitted and received over the same channel using the same antenna 112. A transmitter and a receiver on the wireless device 102 may take turns using the antenna 112, thus allowing the resources to be switched in time. To implement TDD, a diplexer 110 may be used. A diplexer 110 is a passive device that implements frequency domain multiplexing. In one configuration, the diplexer 110 may be removed and the switching circuitry 108 may be coupled directly to the antenna 112.

The wireless device 102 may include an integrated circuit 104. The integrated circuit 104 may include a transceiver 106 (a combination of a transmitter and a receiver). In one configuration, the diplexer 110 may be part of the transceiver 106. The diplexer 110 is a discrete component that is located off of the integrated circuit 104. Typically, a transceiver 106 may include a transmit/receive (T/R) switch that is a discrete component cascaded on the wireless device 102, thereby occupying a lot of area for the system. The cascading of building blocks may hurt the system noise figure. For example, a transmit/receive (T/R) switch that is a discrete component may have 1 decibel (dB) of loss. Furthermore, the transmit/receive (T/R) switch requires matching circuitry for the transmitter and the receiver. Integration of all the components is the ultimate goal towards a true single chip solution that includes front end analog and baseband digital.

Integration of the transmit/receive (T/R) switch and the matching circuitry may be difficult, especially in complementary metal oxide (CMOS) technology. This is because of the limited quality (Q) of the components like an on-chip inductor, which is essential for radio frequency (RF) frontend design at high frequencies. An off-chip inductor may have a quality (Q) of Q>40 while a typical on-chip inductor may have a quality (Q) of Q<10. By eliminating the need for a transmit/receive (T/R) switch and combining the matching circuitry onto the integrated circuit 104, less area usage, lower power consumption and better performance may be obtained.

The transceiver 106 may include the combined matching circuitry 114. The combined matching circuitry 114 may provide impedance matching for a receive (Rx) chain 116 and a transmit (Tx) chain 130 on the transceiver 106. The receive (Rx) chain 116 may include a low noise amplifier (LNA) 120, a mixer 124, a baseband filter 126 and an analog-to-digital converter (ADC) 128. The receive (RX) chain 116 may receive a receive signal 118 from the diplexer 110 via the combined matching circuitry 114. The low noise amplifier (LNA) may have a low noise amplifier (LNA) output 122 that is provided to the mixer 124. The transmit (Tx) chain 130 may include a transmit amplifier 134 (such as a driver amplifier (DA) or a power amplifier (PA)), a mixer 138, a baseband filter 140 and a digital-to-analog (DAC) converter 142. The transmit amplifier 134 may receive a transmit amplifier input 136 from the mixer 138. The transmit (Tx) chain 130 may provide a transmit signal 132 to the diplexer via the combined matching circuitry 114. The combined matching circuitry 114 along with the low noise amplifier (LNA) 120 and the transmit amplifier 134 may be referred to as switching circuitry 108.

Figure 2A:
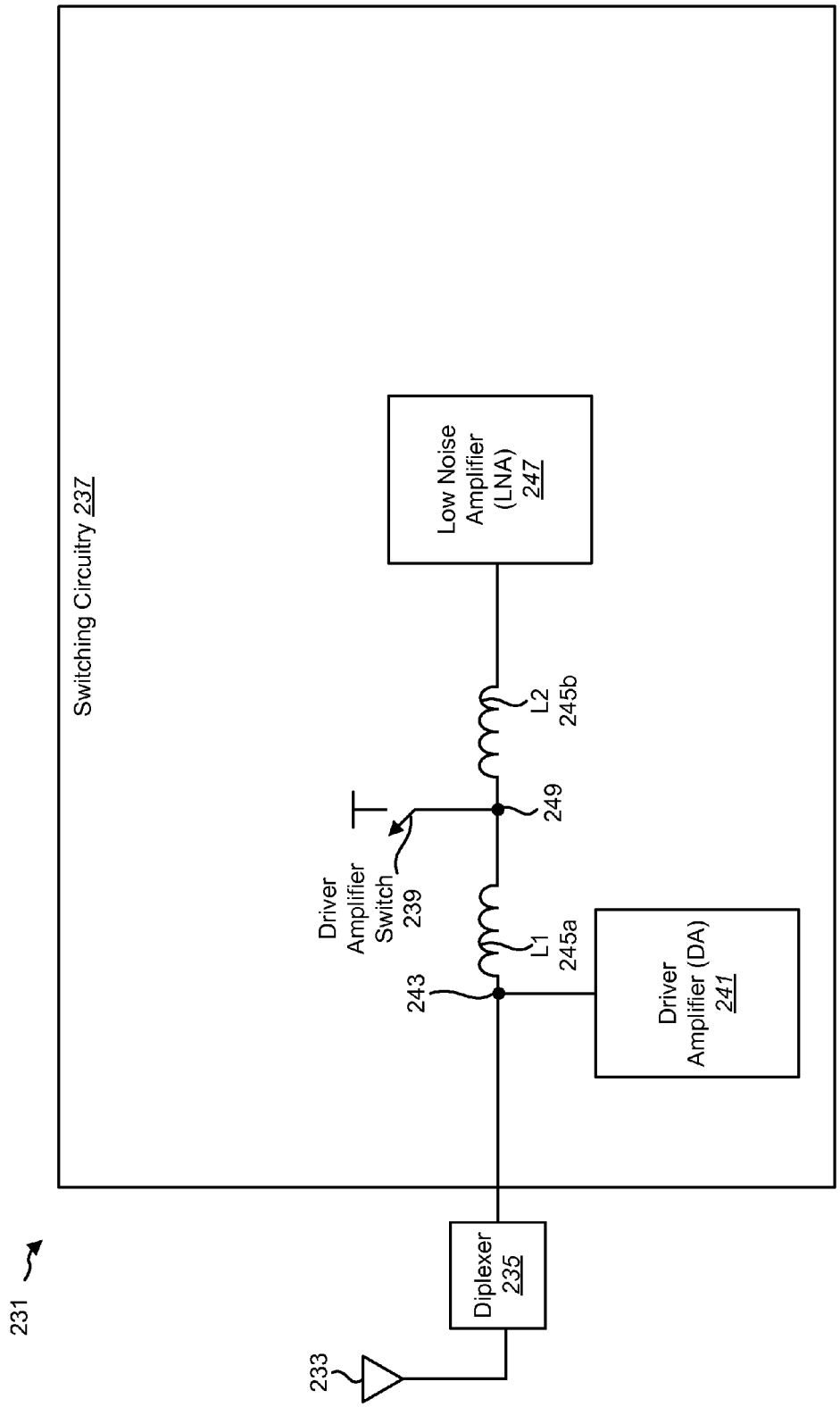
FIG. 2A is a symbolic diagram illustrating a wireless device with switching circuitry.

FIG. 2A is a symbolic diagram illustrating a wireless device 231 with switching circuitry 237. The wireless device 237 of FIG. 2A may be one configuration of the wireless device 102 of FIG. 1. The switching circuitry 237 of FIG. 2A may be one configuration of the switching circuitry 108 of FIG. 1. The switching circuitry 237 may be located on an integrated circuit 104 on the wireless device 102. The switching circuitry 237 may be coupled to an antenna 233 via a diplexer 235.

In one configuration, the switching circuitry 237 may be implemented using complementary metal oxide semiconductor (CMOS) technology. The switching circuitry 237 may also be implemented using other processes such as bipolar transistors, gallium arsenide (GaAs) semiconductor devices, etc.

The switching circuitry 237 may include a first node 243 coupled to the diplexer 235. A driver amplifier (DA) 241 may be coupled to the first node 243. A first inductor L1 245a may also be coupled to the first node 243. The first inductor L1 245a may be coupled to a second node 249. A driver amplifier switch 239 may be coupled between the second node 249 and an AC/DC ground. A second inductor L2 245b may also be coupled to the second node 249. The second inductor L2 245b may also be coupled to a low noise amplifier (LNA) 247. The switching circuitry 237 may then switch between transmitting using the driver amplifier (DA) 241 and receiving using the low noise amplifier (LNA) 247.

Figure 2B:
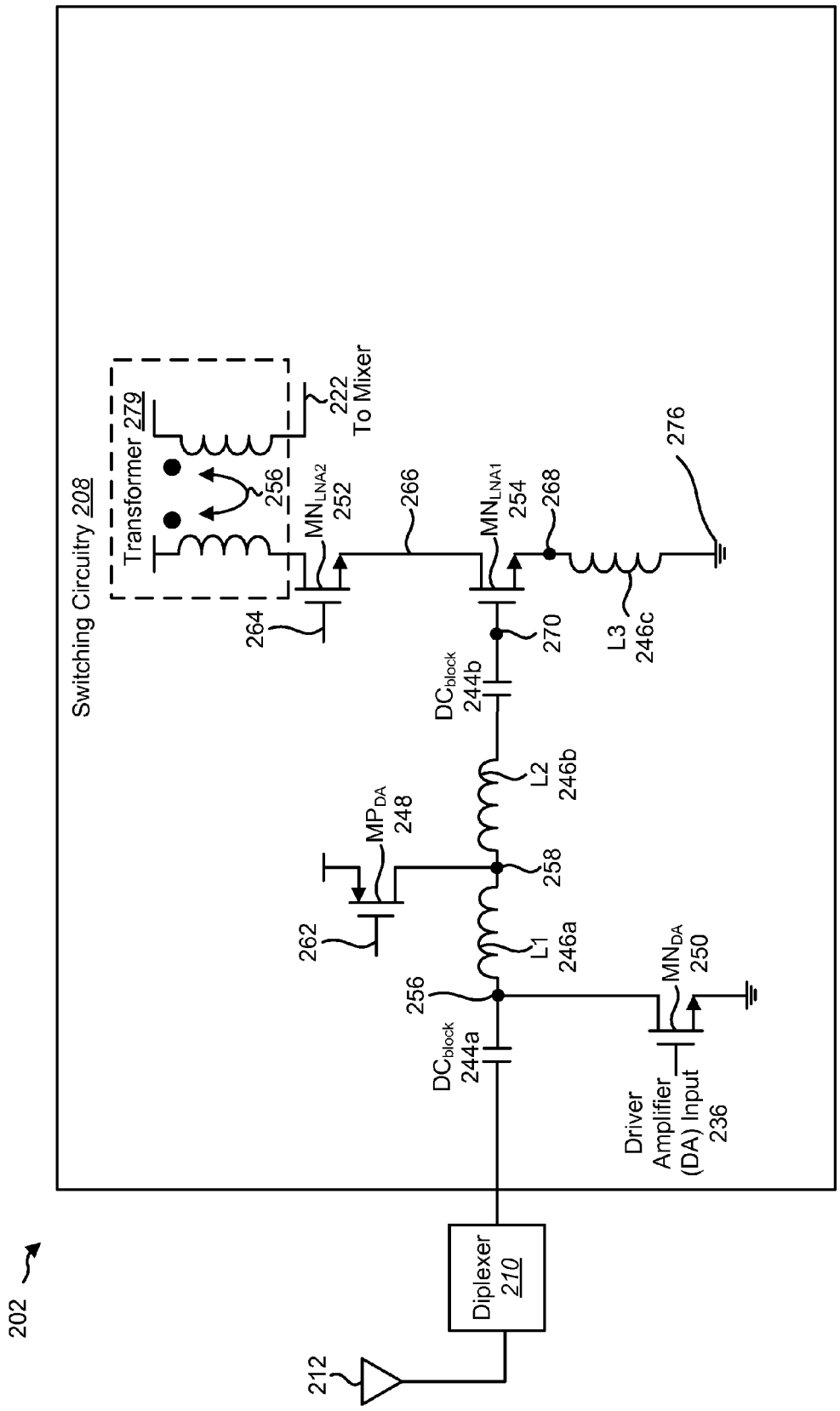
FIG. 2B is a circuit diagram illustrating a wireless device with switching circuitry.

FIG. 2B is a circuit diagram illustrating a wireless device 202 with switching circuitry 208. The wireless device 202 of FIG. 2B may be one configuration of the wireless device 102 of FIG. 1. The switching circuitry 208 of FIG. 2B may be one configuration of the switching circuitry 108 of FIG. 1. The switching circuitry 208 may be located on an integrated circuit 104 on the wireless device 202. The switching circuitry 208 may include a driver amplifier (i.e., a transmit amplifier 134) with matching circuitry and a low noise amplifier (LNA) 120 with matching circuitry. Biasing is not shown in FIG. 2B.

The wireless device 202 may include a diplexer 210 coupled to an antenna 212. The diplexer 210 may also be coupled to the switching circuitry 208. The switching circuitry 208 may include a first $DC_{block}$ capacitor 244a. The first $DC_{block}$ capacitor 244a may be coupled to a first node 256. A first inductor L1 246a may be coupled to the first node 256. A transistor $MN_{DA}$ 250 may be coupled between the first node 256 and ground. The transistor $MN_{DA}$ 250 may be either an n-type transistor (such as an re-channel metal oxide semiconductor (NMOS) transistor) or a p-type transistor (such as a p-channel metal oxide semiconductor (PMOS) transistor) but is illustrated herein as an NMOS transistor with the source of the transistor $MN_{DA}$ 250 coupled to ground and the drain of the transistor $MN_{DA}$ 250 coupled to the first node 256. The gate of the transistor $MN_{DA}$ 250 may be coupled to a driver amplifier (DA) input 236 (i.e., the transmit amplifier input 136). The transistor $MN_{DA}$ 250 may be turned on using a current mirror (not shown) and turned off by putting 0 volts (V) at the gate.

The first inductor L1 246a may be coupled to a second node 258. A second inductor L2 246b may also be coupled to the second node 258. A transistor $MP_{DA}$ 248 may be coupled between the second node and a source voltage. In one configuration, the transistor $MP_{DA}$ 248 may be a PMOS transistor with the source coupled to the second node 258 and the drain coupled to a source voltage. The gate of the transistor $MP_{DA}$ 248 may be coupled to a control signal 262. The transistor $MN_{PA}$ 248 may be turned on by putting 0 volts (V) at the gate (triode region) and turned off by putting the supply voltage at the gate.

In FIG. 2B, the transistor $MP_{DA}$ 248 is shown as a PMOS transistor and the transistor MNDA 250 is shown as an NMOS transistor. However, in another configuration, the transistor $MP_{DA}$ 248 may be an NMOS transistor and the transistor $MN_{DA}$ 250 may be a PMOS transistor. This configuration can save the second $DC_{block}$ capacitor 244b. In one configuration, a matching between the transistor $MP_{DA}$ 248 and the transistor $MN_{DA}$ 250 may be necessary (i.e., if one is an NMOS transistor then the other must be a PMOS transistor). The transistor $MP_{DA}$ 248 of FIG. 2B may be one configuration of the driver amplifier switch 239 of FIG. 2A. The transistor $MN_{DA}$ 250 of FIG. 2B may be one configuration of the driver amplifier (DA) 241 of FIG. 2A.

The second inductor L2 246b may be coupled to a second $DC_{block}$ capacitor 244b. The second $DC_{block}$ capacitor 244 may be coupled to a third node 270. The gate of a first low noise amplifier (LNA) transistor $MN_{LNA1}$ 254 may also be coupled to the third node 270. The first low noise amplifier (LNA) transistor $MN_{LNA1}$ 254 may be an NMOS transistor.

The source of the first low noise amplifier (LNA) transistor $MN_{LNA1}$ 254 may be coupled to a fourth node 268. A third inductor L3 246c may be coupled between the fourth node 268 and a low noise amplifier (LNA) ground 276. The drain of the first low noise amplifier (LNA) transistor $MN_{LNA1}$ 254 may be coupled to a fifth node 266. The source of a second low noise amplifier (LNA) transistor $MN_{LNA2}$ 252 may be coupled to the fifth node 266. The second low noise amplifier (LNA) transistor $MN_{LNA2}$ 252 may be an NMOS transistor. The second low noise amplifier (LNA) transistor $MN_{LNA2}$ 252 may be turned on and off via a control signal 264 applied to the gate. The drain of the second low noise amplifier (LNA) transistor $MN_{LNA2}$ 252 may be coupled to a transformer 279 with magnetic coupling 256 between two inductors. The transformer 279 may then be coupled to a low noise amplifier (LNA) output 222. As discussed above in relation to FIG. 1, the low noise amplifier (LNA) output 222 may be coupled to a mixer 124. The first $DC_{block}$ capacitor 244a at the output and the second $DC_{block}$ capacitor 244b at the low noise amplifier (LNA) input show that the driver amplifier (DA) can use different supply values (i.e., Class 1.5/2/3) for different modes of operation. The class refers to different output power. The easiest way to achieve a different output power is to have a different supply voltage. In other words, a lower supply voltage results in a lower output power. The transistor $MN_{DA}$ 250 and the transistor $MP_{DA}$ 248 may each be 2.5 volt (V) devices to prevent breakdown. For example, if a 2.5 V supply is needed for a higher output power, a 2.5 V device is the only choice without breaking the device during high power operation. This is an intrinsic characteristic of a device. If a 1.3 V device is used under a 2.5 V supply, there will be a good chance that the device breaks, despite the fact that the 1.3 V device has a higher performance than the 2.5 V device.

Figure 3:
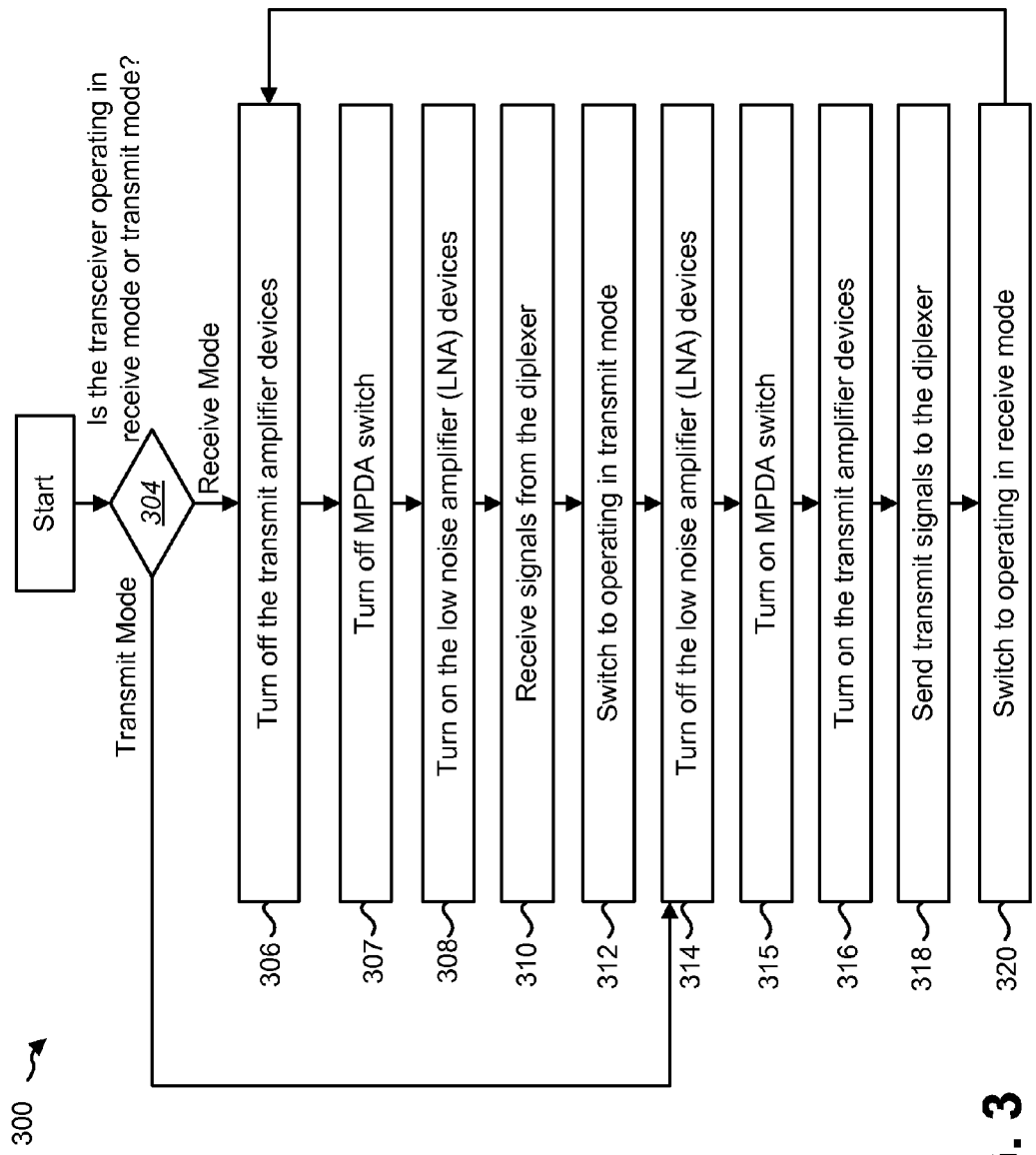
FIG. 3 is a flow diagram of a method for switching between transmit mode and receive mode using combined matching circuitry on an integrated circuit.

FIG. 3 is a flow diagram of a method 300 for switching between transmit mode and receive mode using combined matching circuitry 114 on an integrated circuit 104. The method 300 may be performed by a wireless device 102. The wireless device 102 may include a transceiver 106 that includes switching circuitry 108. The wireless device 102 may determine 304 whether the transceiver 106 is operating in receive mode or transmit mode.

If the transceiver 106 is operating in receive mode, the wireless device 102 may turn off 306 the transmit amplifier 134 devices in the switching circuitry 108. The transmit amplifier 134 devices may include those devices associated with the driver amplifier (DA). For example, the transmit amplifier 134 devices may include the transistor $MN_{DA}$ 250 of FIG. 2B. Other devices associated with the transmit amplifier 134 that are not shown in FIG. 2B (such as those discussed below in relation to FIGS. 8, 11 and 13) may also be turned off. The wireless device 102 may then turn off 307 an $MP_{DA}$ switch. In one configuration, the $MP_{DA}$ switch may be the transistor $MP_{DA}$ 248.

The wireless device 102 may turn on 308 low noise amplifier (LNA) devices in the switching circuitry 108. The low noise amplifier (LNA) devices may include those devices associated with the low noise amplifier (LNA) 120. For example, the low noise amplifier (LNA) devices may include the first low noise amplifier (LNA) transistor $MN_{LNA1}$ 254, the second low noise amplifier (LNA) transistor $MN_{LNA2}$ 252 and the transformer 279 of FIG. 2B. The wireless device 102 may then receive a signal from the diplexer 110. The received signal may be received and amplified by the low noise amplifier (LNA) 120 after impedance matching by the combined matching circuitry 114 before being passed on to the mixer 124 on the transceiver 106 as part of a receive (Rx) chain 116. The wireless device 102 may then switch 312 to operating the transceiver 106 in transmit mode.

If the transceiver 106 is operating in transmit mode, the wireless device 102 may turn off 314 the low noise amplifier (LNA) devices. The wireless device 102 may also turn on 1315 the MPDA switch. The wireless device 102 may then turn on 316 the transmit amplifier 134 devices. The wireless device 102 may send 318 transmit signals to the diplexer 110. The transmit signals may be signals input to a driver amplifier (DA) from a mixer 138 on the transceiver 106 as part of a transmit (Tx) chain 130. The wireless device 102 may switch 320 to operating the transceiver 106 in receive mode.

Figure 4:
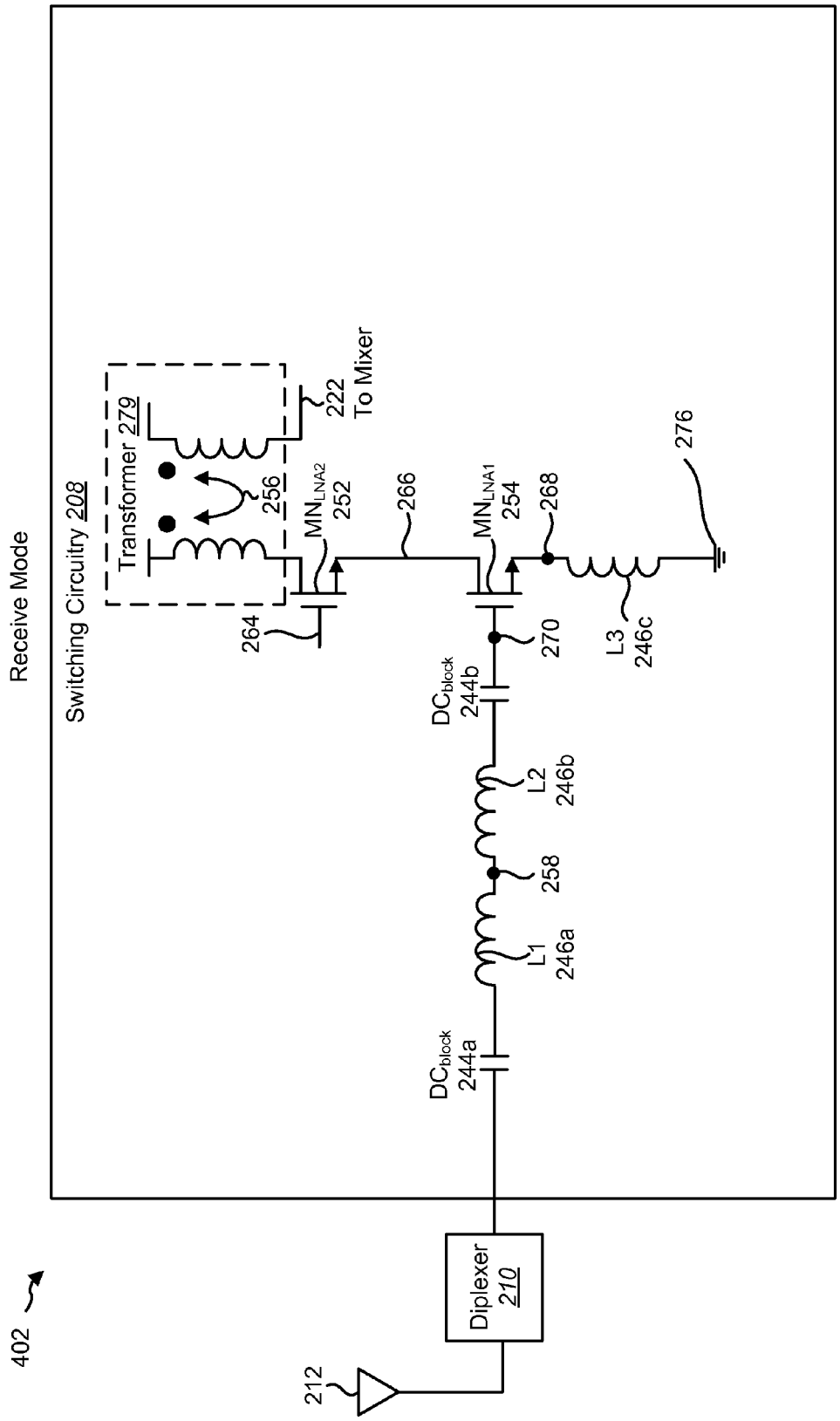
FIG. 4 is a circuit diagram illustrating a wireless device with switching circuitry that is operating in receive mode.

FIG. 4 is a circuit diagram illustrating a wireless device 402 with switching circuitry 208 that is operating in receive mode. The switching circuitry 208 of FIG. 4 may be the switching circuitry 208 of FIG. 2B. The wireless device 402 may be operating in receive mode if a transceiver 106 on the wireless device 402 is operating in receive mode. In FIG. 4, the driver amplifier (DA) devices (i.e., the transistor $MP_{DA}$ 248 and the transistor $MN_{DA}$ 250) have been turned off and are thus not illustrated. When the driver amplifier (DA) devices have been turned off, they have a high impedance that does not load down the low noise amplifier (LNA) 120.

The first inductor L1 246a and the second inductor L2 246b may be connected in series to form a gate matching inductor for the low noise amplifier (LNA) 120. The gate matching inductor may thus form part of a conventional source degeneration matching low noise amplifier (LNA) 120.

Figure 5:
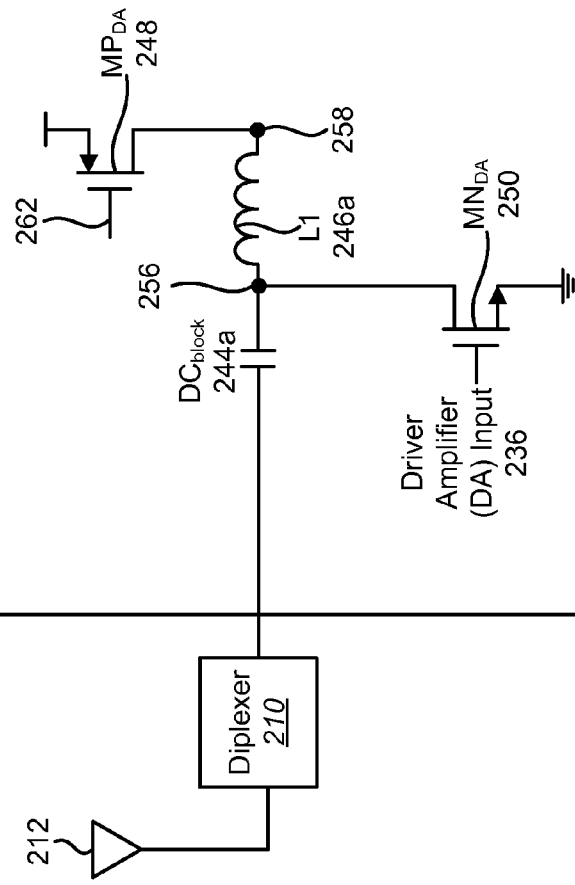
FIG. 5 is a circuit diagram illustrating a wireless device with switching circuitry that is operating in transmit mode.

FIG. 5 is a circuit diagram illustrating a wireless device 502 with switching circuitry 208 that is operating in transmit mode. The switching circuitry 208 of FIG. 5 may be the switching circuitry 208 of FIG. 2B. The wireless device 502 may be operating in transmit mode if a transceiver 106 on the wireless device 502 is operating in transmit mode. In FIG. 5, the low noise amplifier (LNA) devices (i.e., the low noise amplifier (LNA) transistor $MN_{LNA1}$ 254 and the low noise amplifier (LNA) transistor $MN_{LNA2}$ 252) have been turned off and are thus not illustrated.

In transmit mode, the transistor $MP_{DA}$ 248 may operate in the triode region and thus may ideally have no direct current (DC) voltage drop across it. Thus, the second node 258 may ideally be alternating current (AC) grounded. The output of the driver amplifier (DA) (i.e., the first node 256) is directly at the diplexer 210 input (via the first $DC_{block}$ capacitor 244a). Thus, no additional loss is incurred and power is saved compared to a traditional system (i.e., one where a transmit/receive (T/R) switch is needed).

Figure 6:
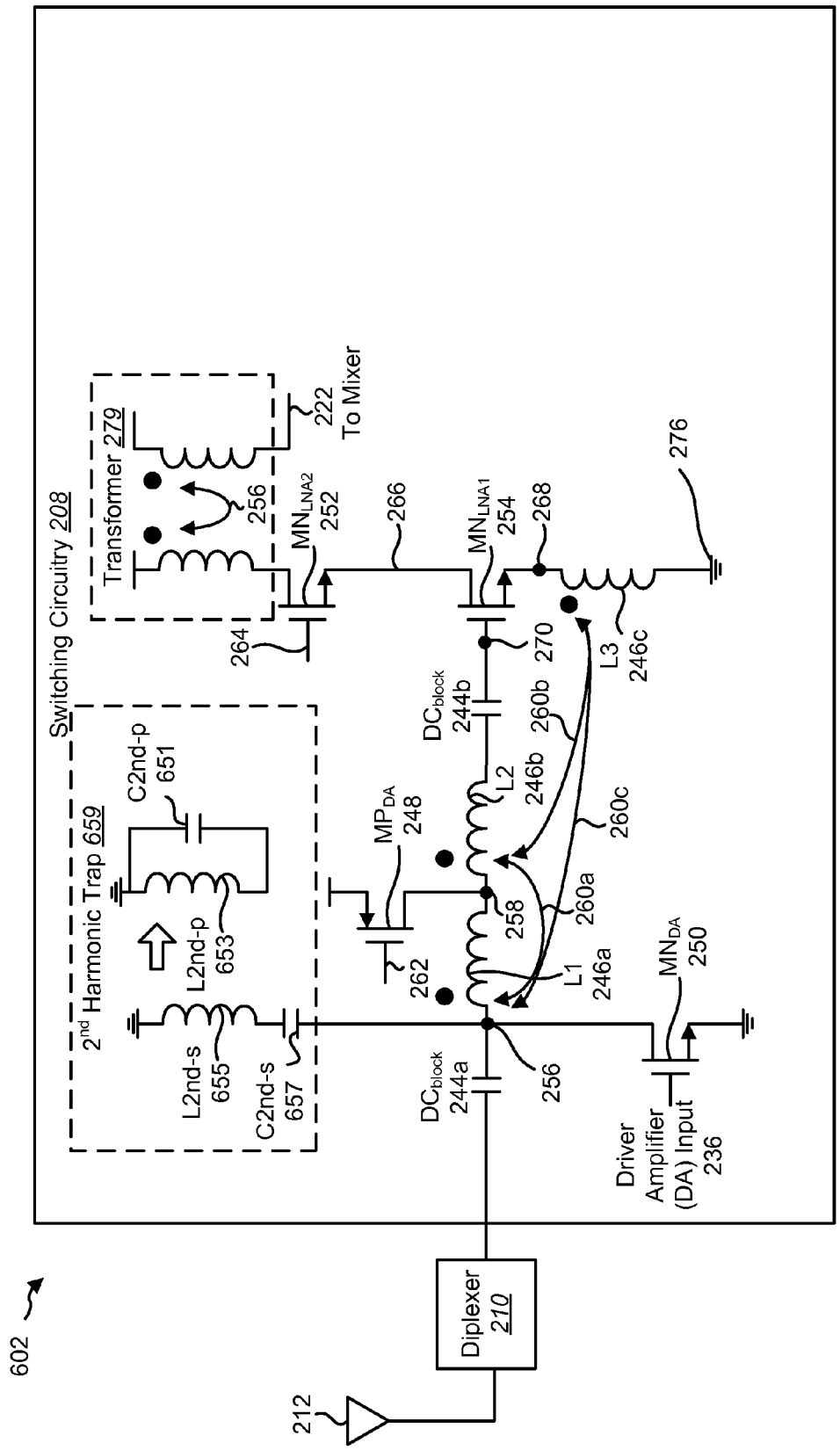
FIG. 6 is a circuit diagram illustrating a wireless device with switching circuitry where all inductors are magnetically coupled.

FIG. 6 is a circuit diagram illustrating a wireless device 602 with switching circuitry 208 where all inductors are magnetically coupled. The switching circuitry 208 of FIG. 6 may be the switching circuitry 208 of FIG. 2B. However, the switching circuitry 208 of FIG. 6 may include a $2^{nd}$ harmonic trap 659. The $2^{nd}$ harmonic trap 659 may include an inductor L2nd-s 655 coupled between ground and a capacitor C2nd-s 657. The capacitor C2nd-s 657 may be coupled to the first node 256. The values for the inductor L2nd-s 655 and the capacitor C2nd-s 657 may provide a simple LC tank that is resonant at the $2^{nd}$ harmonic frequency. The inductor L2nd-s 655 may be splitted to a parallel resonant tank (i.e., the inductor L2nd-s 655 is transformed) so that a desirable signal is not affected by the tank. After transformation, the byproduct of inductor L2nd-s 655 is illustrated as an inductor L2nd-p 653 and a capacitor C2nd-p 651 in parallel between the capacitor C2nd-s 657 and ground. The wanted signal may then be maintained, due to the new formed tank while maintaining a trap function at other frequencies.

To efficiently use real estate on the integrated circuit 104, the first inductor L1 246a and the second inductor L2 246b may be combined as a conventional low noise amplifier (LNA) matching design. A tap point (i.e., the second node 258) may be selected to connect to the transistor $MP_{DA}$ 248 (referred to as the head switch). Additional area reduction can be made by combining the third inductor L3 246c with the first inductor L1 246a and the second inductor L2 246b as a gate source coupled transformer. One possible layout for the first inductor L1 246a, second inductor L2 246b and third inductor L3 246c is discussed below in relation to FIG. 7.

In transmit mode, a signal with large amplitude may magnetically couple 260a from the first inductor L1 246a to the second inductor L2 246b. A switch (not shown) at the low noise amplifier (LNA) input (i.e., the third node 270) to ground may shunt the AC signal to make sure the AC signal at the low noise amplifier (LNA) input is at ground. The magnetic coupling factor between the first inductor L1 246a and the second inductor L2 246b and the target output power may each not be very large; the magnetic coupling 260a from the first inductor L1 246a to the second inductor L2 246b may not significantly affect the performance of the switching circuit 208. A magnetic coupling 260b may also occur between the second inductor L2 246b and the third inductor L3 246c. A magnetic coupling 260c may further occur between the first inductor L1 246a and the third inductor L3 246c.

Figure 7:
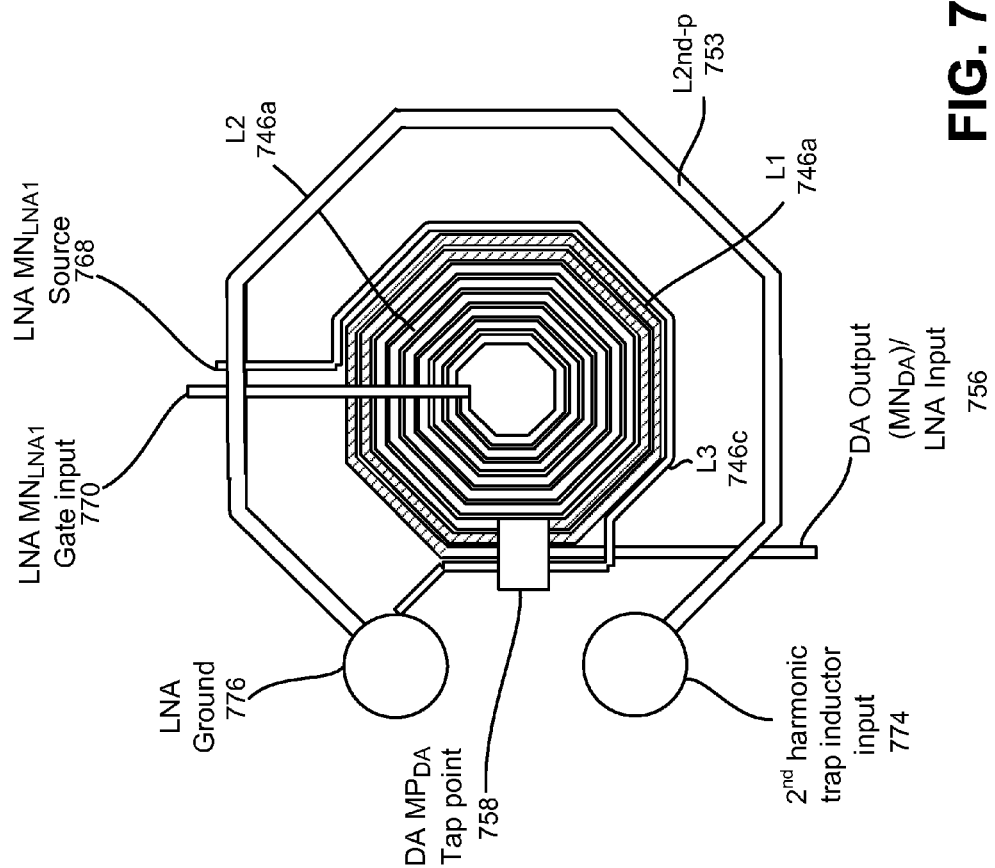
FIG. 7 illustrates one layout example of the first inductor L1, the second inductor L2, the third inductor L3 and the inductor L2nd-p.

FIG. 7 illustrates one example of the first inductor L1 746a, the second inductor L2 746b, the third inductor L3 746c and the inductor L2nd-p 753 that are magnetically coupled. The first $DC_{block}$ capacitor 244a and the second $DC_{block}$ capacitor 244b are not shown in the layout.

The second inductor L2 746b may be coiled within the coils of the first inductor L1 746a. The first inductor L1 746a may be coiled within a single coil of the third inductor L3 746c. The third inductor L3 746c may be coupled to the source 768 (i.e., the fourth node 268) of the first low noise amplifier (LNA) transistor $MN_{LNA1}$ 254 and the low noise amplifier (LNA) ground 776. The inductor L2nd-p 753 may surround the first inductor L1 746a, second inductor L2 746b and third inductor L3 746c with a reasonable spacing to minimize magnetic coupling. The inductor L2nd-p 753 may run from a $2^{nd}$ harmonic trap inductor input 774 to the low noise amplifier (LNA) ground 776. The tap point 758 (i.e., the second node 258) between the first inductor L1 746a and the second inductor L2 746b is also illustrated. The second inductor L2 746b may be coupled to the first low noise amplifier (LNA) transistor $MN_{LNA1}$ 254 gate 770. The driver amplifier (DA) output/low noise amplifier (LNA) input 756 (i.e., the second node 256) is also illustrated. A top metal layer may be used for better performance.

Figure 8A:
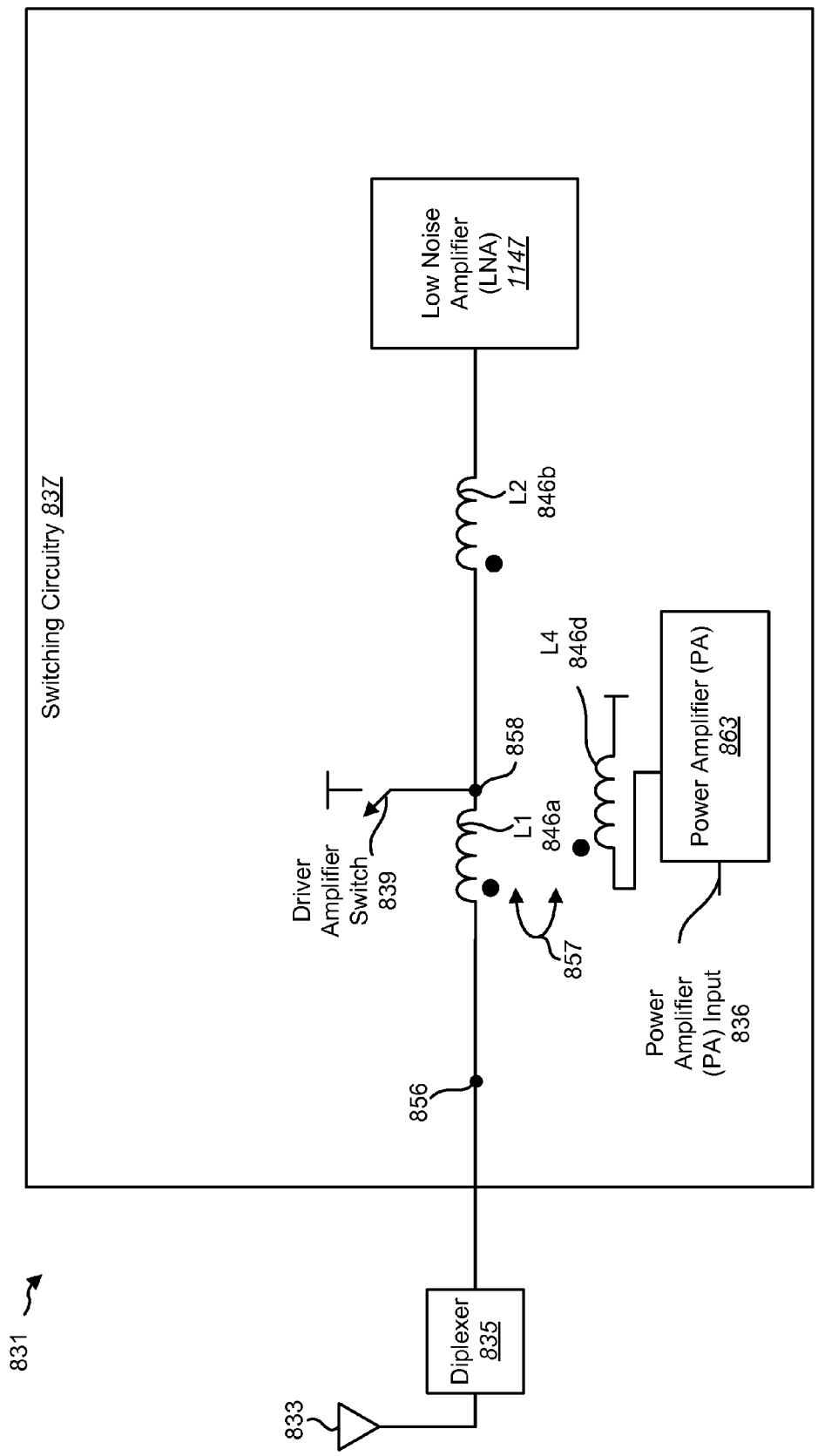
FIG. 8A is a symbolic diagram illustrating a wireless device with switching circuitry for higher output transmit power.

FIG. 8A is a symbolic diagram illustrating a wireless device 831 with switching circuitry 837 for higher output transmit power. The wireless device 831 of FIG. 8A may be one configuration of the wireless device 102 of FIG. 1. The switching circuitry 837 of FIG. 11A may be one configuration of the switching circuitry 808 of FIG. 1. The switching circuitry 837 may be located on an integrated circuit 104 on the wireless device 102. The switching circuitry 837 may be coupled to an antenna 833 via a diplexer 835.

The switching circuitry 837 may include a first node 856 coupled to the diplexer 835. A first inductor L1 846a may be coupled to the first node 856. The first inductor L1 846a may also be coupled to a second node 858. A driver amplifier switch 839 may be coupled between the second node 858 and an AC/DC ground. A second inductor L2 846b may be coupled between the second node 858 and a low noise amplifier 847.

The switching circuitry 837 may include an inductor L4 846d coupled to a source voltage. The inductor L4 846d may be coupled to a power amplifier (PA) 861 with a power amplifier (PA) input 836. A magnetic coupling 857 between the first inductor L1 846a and the inductor L4 846d may occur. The power amplifier (PA) 861 and the low noise amplifier (LNA) 847 are discussed in additional detail below in relation to FIG. 8B.

Figure 8B:
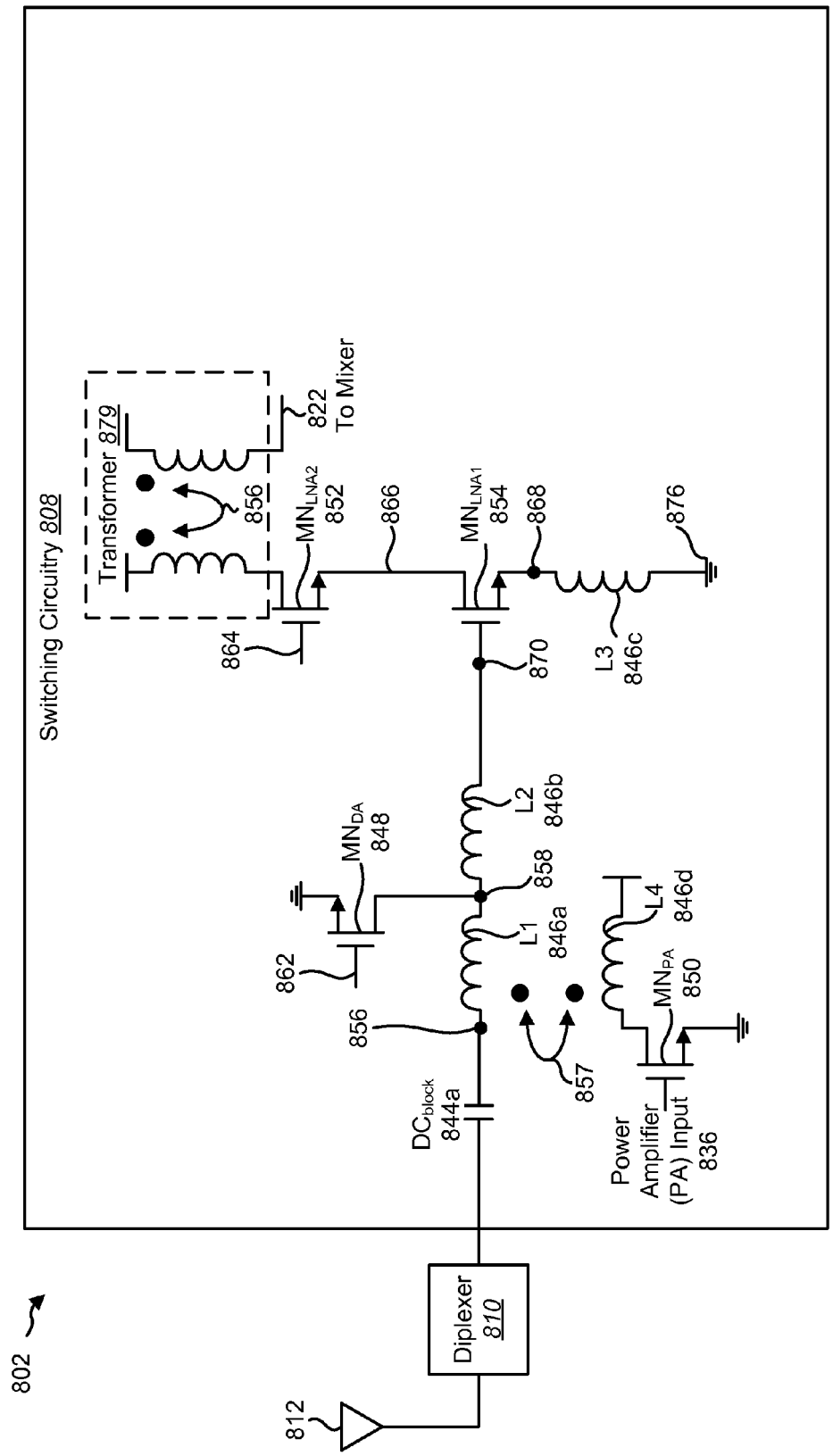
FIG. 8B is a circuit diagram illustrating a wireless device with switching circuitry for higher output transmit power.

FIG. 8B is a circuit diagram illustrating a wireless device 802 with switching circuitry 808 for higher output transmit power. The wireless device 802 of FIG. 8B may be one configuration of the wireless device 102 of FIG. 1. The switching circuitry 808 of FIG. 8B may be one configuration of the switching circuitry 108 of FIG. 1. The switching circuitry 808 may be located on an integrated circuit 104 on the wireless device 802. The switching circuitry 808 configuration of FIG. 8B may be selected to obtain a higher output power. The switching circuitry 808 may include a driver amplifier (DA) or power amplifier (PA) with matching circuitry and a low noise amplifier (LNA) 120 with matching circuitry.

The wireless device 802 may include a diplexer 810 coupled to an antenna 812. The diplexer 810 may also be coupled to the switching circuitry 808. The switching circuitry 808 may include a first $DC_{block}$ capacitor 844a. The first $DC_{block}$ capacitor 844a may be coupled to a first node 856. A first inductor L1 846a may also be coupled to the first node 856.

The first inductor L1 846a may be coupled to a second node 858. A second inductor L2 846b may also be coupled to the second node 858. The drain of a transistor $MN_{DA}$ 848 may be coupled to the second node 858. The transistor $MN_{DA}$ 848 may be an NMOS transistor or a PMOS transistor but is illustrated in FIG. 8B as an NMOS transistor. The source of the transistor $MN_{DA}$ 848 may be coupled to ground. The gate of the transistor $MN_{DA}$ 848 may be coupled to a control signal 862. The second inductor L2 846b may be coupled to a third node 870. The gate of a first low noise amplifier (LNA) transistor $MN_{LNA1}$ 854 may also be coupled to the third node 870. The first low noise amplifier (LNA) transistor $MN_{LNA1}$ 854 may be an NMOS transistor.

The source of the first low noise amplifier (LNA) transistor $MN_{LNA1}$ 854 may be coupled to a fourth node 868. A third inductor L3 846c may be coupled between the fourth node 868 and a low noise amplifier (LNA) ground 876. The drain of the first low noise amplifier (LNA) transistor $MN_{LNA1}$ 854 may be coupled to a fifth node 866. The source of a second low noise amplifier (LNA) transistor $MN_{LNA2}$ 852 may be coupled to the fifth node 866. The second low noise amplifier (LNA) transistor $MN_{LNA2}$ 852 may be an NMOS transistor. The second low noise amplifier (LNA) transistor $MN_{LNA2}$ 852 may be turned on and off via a control signal 864 applied to the gate. The drain of the second low noise amplifier (LNA) transistor $MN_{LNA2}$ 852 may be coupled to a transformer 879. Magnetic coupling 856 between two inductors may occur in the transformer 879. The transformer 879 may then be coupled to a low noise amplifier (LNA) output 822. As discussed above in relation to FIG. 1, the low noise amplifier (LNA) output 822 may be coupled to a mixer 124.

A fourth inductor L4 846d may be coupled to a source voltage and to the drain of a transistor $MN_{PA}$ 850. The transistor $MN_{PA}$ 850 may be an NMOS transistor or a PMOS transistor but is illustrated herein as an NMOS transistor. The gate of the transistor $MN_{PA}$ 850 may be coupled to a power amplifier (PA) input 836. The power amplifier (PA) input 836 of FIG. 8B may be the transmit amplifier input 136 of FIG. 1. The source of the transistor $MN_{PA}$ 850 may be coupled to ground. The fourth inductor L4 846d may be located close enough to the first inductor L1 846a that magnetic coupling 857 occurs between the first inductor L1 846a and the fourth inductor L4 846d. The output power may be determined by the turn ratio between the first inductor L1 846a and the fourth inductor L4 846d.

In one configuration, the first inductor L1 846a and the fourth inductor L4 846d may magnetically couple each other. The second inductor L2 846b and the third inductor L3 846c may magnetically couple each other. In one example, the first inductor L1 846a and the fourth inductor 846d may not couple the second inductor L2 846b and the third inductor 846c. This may be referred to as partial magnetic coupling. It is not necessary that the second inductor L2 846b and the third inductor L3 846c are magnetically coupled with each other.

Figure 9:
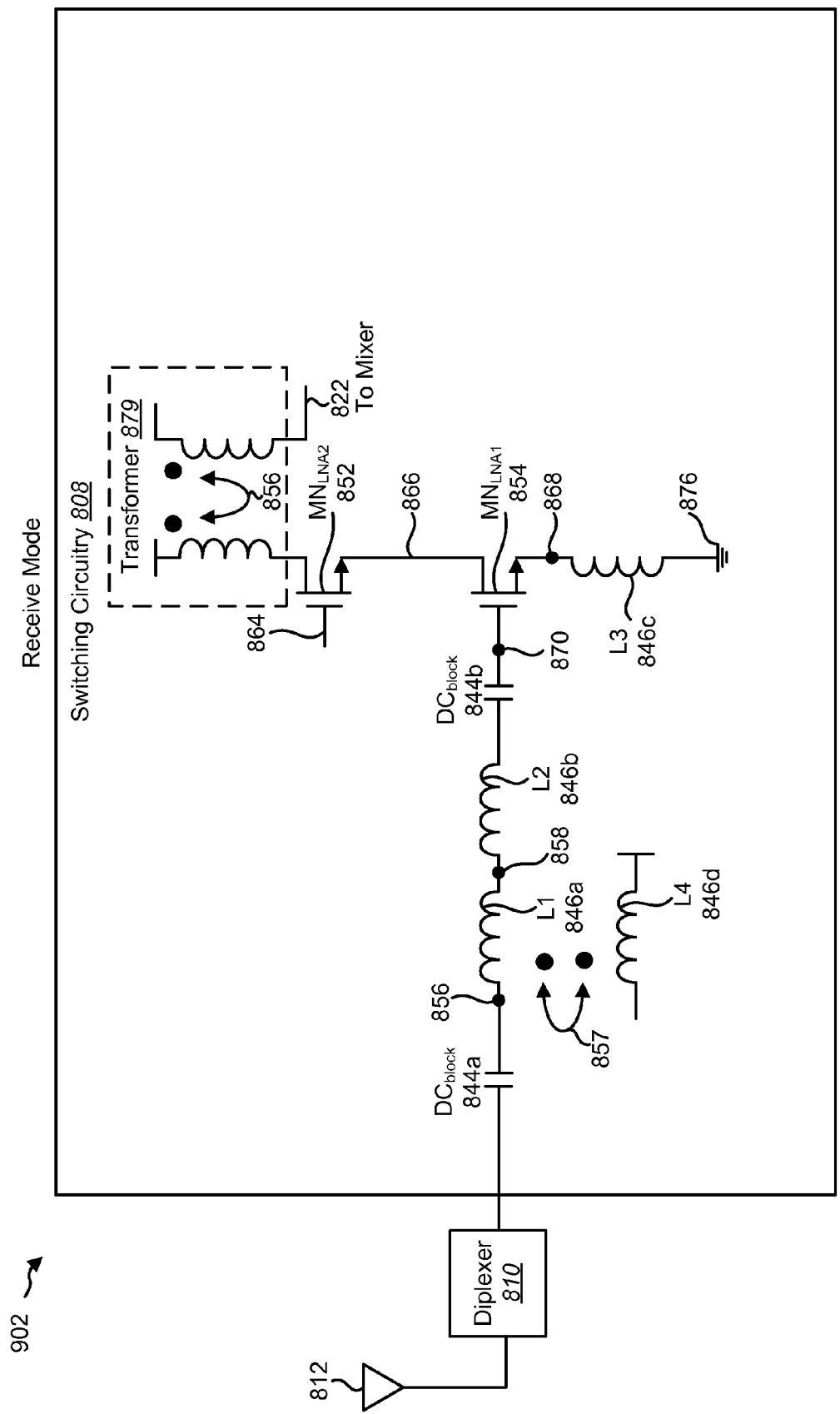
FIG. 9 is a circuit diagram illustrating a wireless device with switching circuitry for higher output transmit power that is operating in receive mode.

FIG. 9 is a circuit diagram illustrating a wireless device 902 with switching circuitry 808 for higher output transmit power that is operating in receive mode. The switching circuitry 808 of FIG. 9 may be the switching circuitry 808 of FIG. 8B. The wireless device 902 may be operating in receive mode if a transceiver 106 on the wireless device 902 is operating in receive mode. In FIG. 9, the power amplifier (PA) devices (i.e., the transistor $MN_{PA}$ 848 and the transistor $MN_{PA}$ 850) have been turned off and thus are not illustrated. When the power amplifier (PA) devices have been turned off, they have a high impedance that does not load down the low noise amplifier (LNA) 120.

A magnetic coupling 857 between the first inductor L1 846a and the fourth inductor L4 846d may still occur. The first inductor L1 846a and the second inductor L2 846b may be connected in series to form a gate matching inductor for the low noise amplifier (LNA) 120. The gate matching inductor may thus form part of a conventional source degeneration matching low noise amplifier (LNA) 120.

Figure 10:
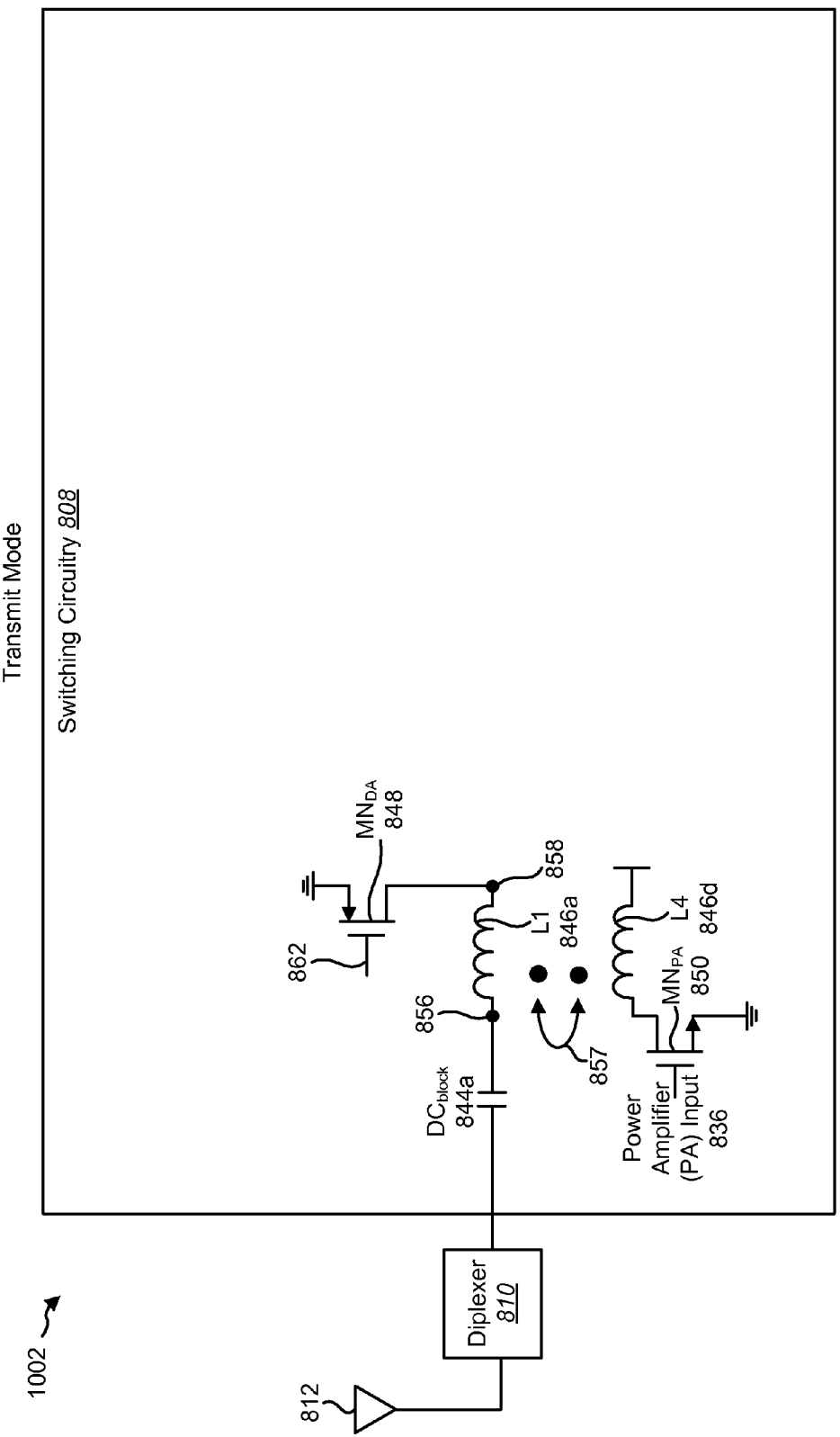
FIG. 10 is a circuit diagram illustrating a wireless device with switching circuitry for higher output transmit power that is operating in transmit mode.

FIG. 10 is a circuit diagram illustrating a wireless device 1002 with switching circuitry 808 for higher transmit power that is operating in transmit mode. The switching circuitry 808 of FIG. 10 may be the switching circuitry 808 of FIG. 8B. The wireless device 1002 may be operating in transmit mode if a transceiver 106 on the wireless device 1002 is operating in transmit mode. In FIG. 10, the low noise amplifier (LNA) devices (i.e., the first low noise amplifier (LNA) transistor $MN_{LNA1}$ 854 and the second low noise amplifier (LNA) transistor $MN_{LNA2}$ 852) have been turned off and are thus not illustrated.

In transmit mode, the transistor $MN_{DA}$ 848 is turned on to provide an AC ground to the second node 858. The optimum impedance of the power amplifier (PA) is primarily based on the first inductor L1 846a and fourth inductor L4 846d turn ratio. A magnetic coupling 857 may occur between the first inductor L1 846a and the fourth inductor L4 846d as part of the operation of the power amplifier (PA).

Figure 11A:
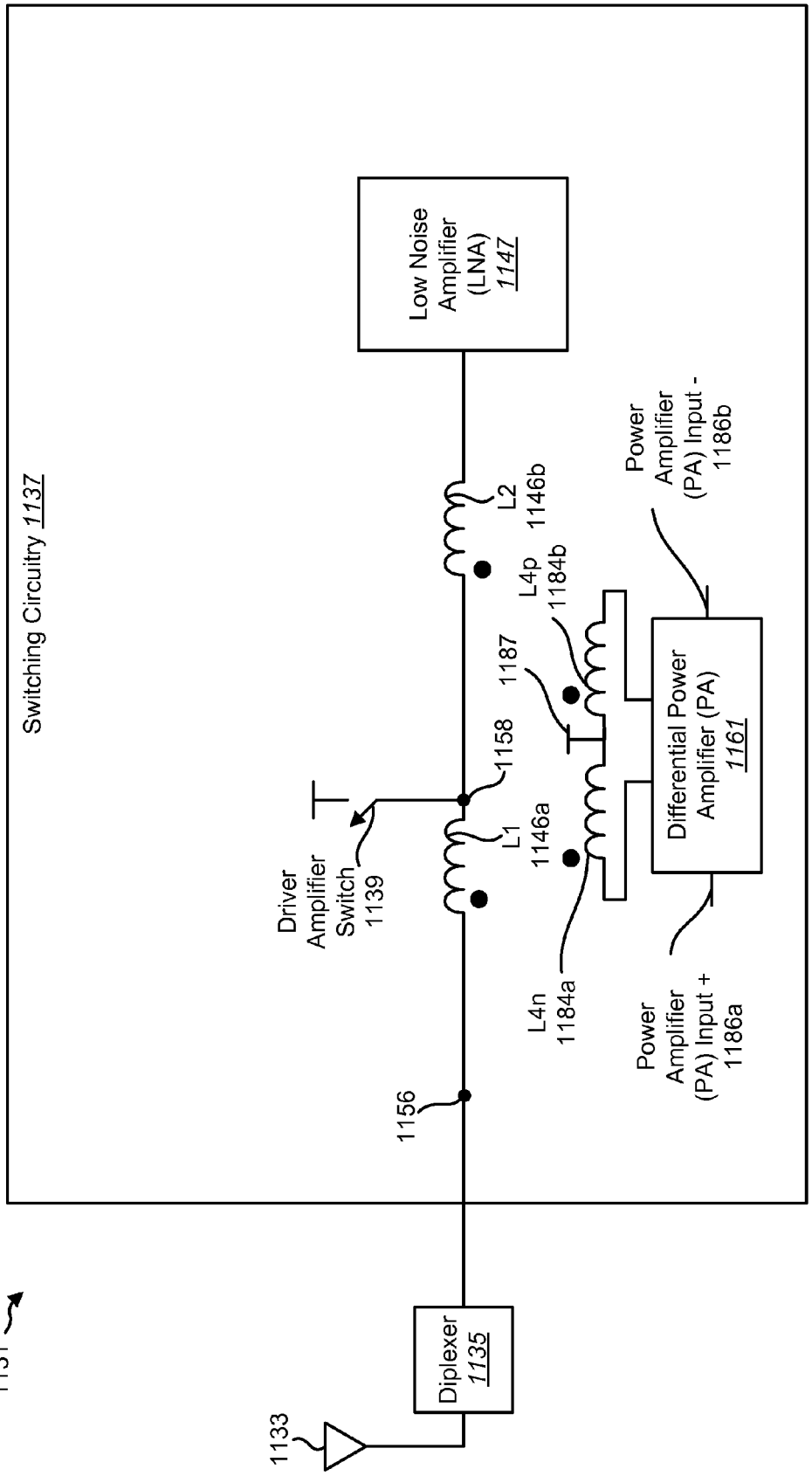
FIG. 11A is a symbolic diagram illustrating a wireless device with switching circuitry.

FIG. 11A is a symbolic diagram illustrating a wireless device 1131 with switching circuitry 1137. The wireless device 1131 of FIG. 11A may be one configuration of the wireless device 102 of FIG. 1. The switching circuitry 1137 of FIG. 11A may be one configuration of the switching circuitry 1108 of FIG. 1. The switching circuitry 1137 may be located on an integrated circuit 104 on the wireless device 102. The switching circuitry 1137 may be coupled to an antenna 1133 via a diplexer 1135.

The switching circuitry 1137 may include a first node 1156 coupled to the diplexer 1135. A first inductor L1 1146a may be coupled to the first node 1156. The first inductor L1 1146a may also be coupled to a second node 1158. A driver amplifier switch 1139 may be coupled between the second node 1158 and an AC/DC ground. A second inductor L2 1146b may be coupled between the second node 1158 and a low noise amplifier 1147.

The switching circuitry 1137 may include an inductor L4n 1184a and an inductor L4p 1184b coupled to a source voltage 1187. The inductor L4n 1184a and the inductor L4p 1184b may each be coupled to a differential power amplifier (PA) 1161 with a positive power amplifier (PA) input 1186a and a negative power amplifier (PA) input 1186b. A magnetic coupling between the first inductor L1 1146a, the second inductor L2 1146b and the inductors L4n 1184a and L4p 1184b may occur. The differential power amplifier (PA) 1161 and the low noise amplifier (LNA) 1147 are discussed in additional detail below in relation to FIG. 11B.

Figure 11B:
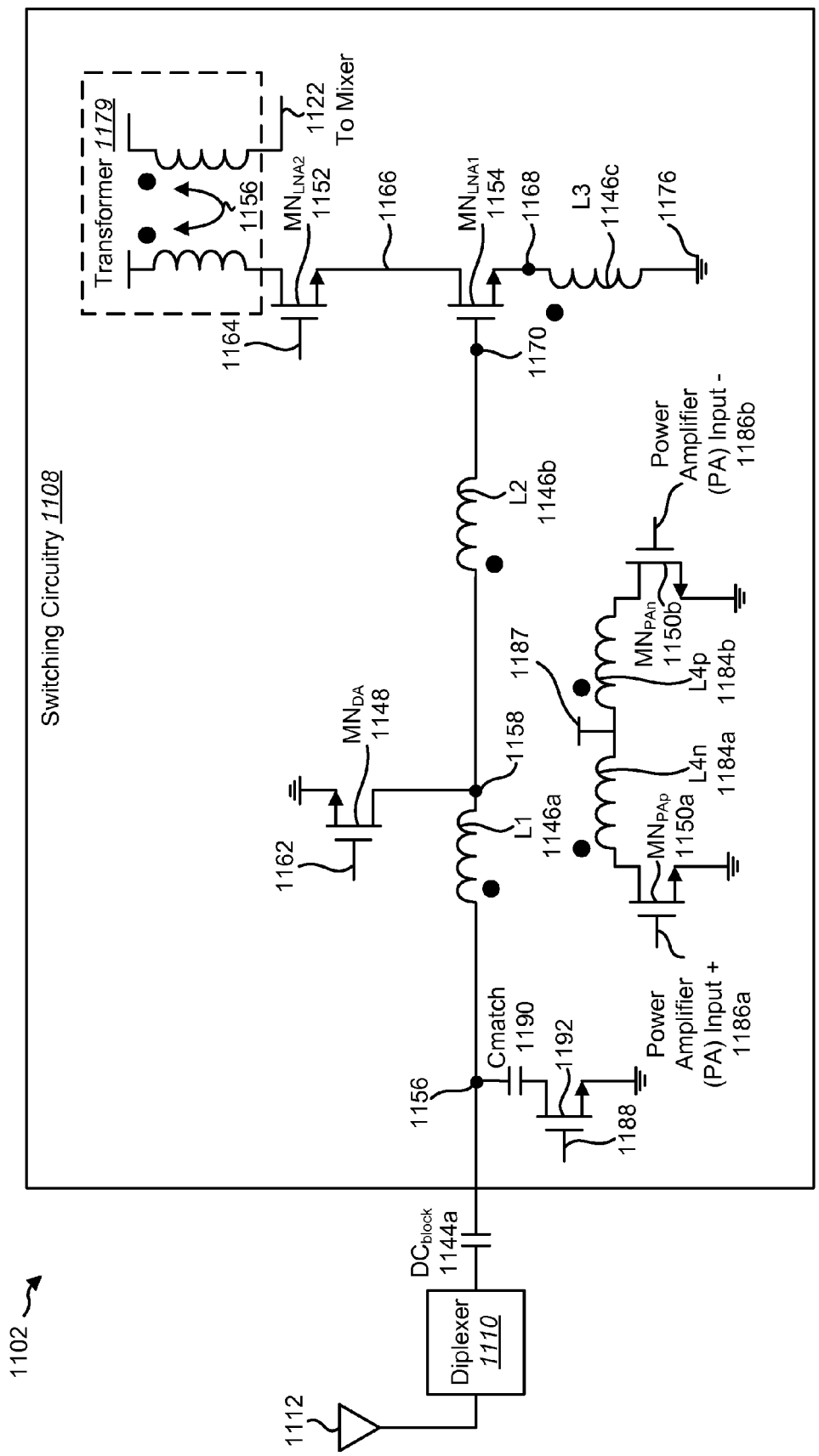
FIG. 11B is a circuit diagram illustrating a wireless device with switching circuitry for higher output power with a differential power amplifier (PA)

FIG. 11B is a circuit diagram illustrating a wireless device 1102 with switching circuitry 1108 for higher output power with a differential power amplifier (PA). The wireless device 1102 of FIG. 11B may be one configuration of the wireless device 102 of FIG. 1. The switching circuitry 1108 of FIG. 11B may be one configuration of the switching circuitry 108 of FIG. 1. The switching circuitry 1108 may be located on an integrated circuit 104 on the wireless device 1102. The switching circuitry 1108 may include a differential input power amplifier (PA) with matching circuitry and a low noise amplifier (LNA) 120 with matching circuitry.

The wireless device 1102 may include a diplexer 1110 coupled to an antenna 1112. The diplexer 1110 may also be coupled to a first $DC_{block}$ capacitor 1144a. In one configuration, the first $DC_{block}$ capacitor 1144a may be a discrete component that is not part of the switching circuitry 1108. In another configuration, the first $DC_{block}$ capacitor 1144a may be an integrated component that is part of the switching circuitry 1108. The first $DC_{block}$ capacitor 1144a may be coupled to a first node 1156 on the switching circuitry 1108. A matching capacitor Cmatch 1190 may be coupled to the first node 1156 and to the drain of a transistor 1192. The transistor 1192 may be an NMOS transistor. The gate of the transistor 1192 may receive a control signal 1188. The control signal 1188 may turn on the transistor 1192 when the wireless device 1102 is in transmit mode. The source of the transistor 1192 may be connected to ground.

A first inductor L1 1146a may be coupled to the first node 1156 and to a second node 1158. The drain of a transistor MN$_{DA}$ 1148 may be coupled to the second node 1158. The transistor MN$_{DA}$ 1148 may be either an NMOS transistor or a PMOS transistor but is illustrated as an NMOS transistor herein. The source of the transistor MN$_{DA}$ 1148 may be coupled to ground. The gate of the transistor MN$_{DA}$ 1148 may receive a control signal 1162 that turns the transistor MN$_{DA}$ 1148 on and off. The transistor MN$_{DA}$ 1148 may be turned on during transmit mode and turned off during receive mode.

A second inductor L2 1146*b* may be coupled to the second node 1158. The second inductor L2 1146*b* may also be coupled to a third node 1170. The gate of a first low noise amplifier (LNA) transistor MN$_{LNA1}$ 1154 may be coupled to the third node 1170. In one configuration, the first low noise amplifier (LNA) transistor MN$_{LNA1}$ 1154 may be an NMOS transistor.

The source of the first low noise amplifier (LNA) transistor MN$_{LNA1}$ 1154 may be coupled to a fourth node 1168. A third inductor L3 1146*c* may be coupled to the fourth node 1168 and to a low noise amplifier (LNA) ground 1176. The drain of the first low noise amplifier (LNA) transistor MN$_{LNA1}$ 1154 may be coupled to a fifth node 1166. The source of a second low noise amplifier (LNA) transistor MN$_{LNA2}$ 1152 may be coupled to the fifth node 1166. The second low noise amplifier (LNA) transistor MN$_{LNA2}$ 1152 may be turned on and off via a control signal 1164 applied to the gate of the second low noise amplifier (LNA) transistor MN$_{LNA2}$ 1152. The drain of the second low noise amplifier (LNA) transistor MN$_{LNA2}$ 1152 may be coupled to a transformer 1179. The transformer 1179 may include a magnetic coupling 1156 between two inductors. The transformer 1179 may then be coupled to a low noise amplifier (LNA) output 1122. As discussed above in relation to FIG. 1, the low noise amplifier (LNA) output 1122 may be coupled to a mixer 124.

The switching circuitry 1108 may include an inductor L4*n* 1184*a* and an inductor L4*p* 1184*b* that are each coupled to a source voltage (Vdd) 1187. The inductor L4*n* 1184*a* may be coupled to the drain of a transistor MN$_{PAp}$ 1150*a*. In one configuration, the transistor MN$_{PAp}$ 1150*a* may be an NMOS transistor. The source of the transistor MN$_{PAp}$ 1150*a* may be coupled to ground. The gate of the transistor MN$_{PAp}$ 1150*a* may receive a positive power amplifier (PA) differential input 1186*a*.

The inductor L4*p* 1184*b* may be coupled to the drain of a transistor MN$_{PAn}$ 1150*b*. In one configuration, the transistor MN$_{PAn}$ 1150*b* may be an NMOS transistor. The source of the transistor MN$_{PAn}$ 1150*b* may be coupled to ground. The gate of the transistor MN$_{PAn}$ 1150*b* may receive a negative power amplifier (PA) differential input 1186*b*. The inductor L4*n* 1184*b* and the inductor L4*p* 1184*a* may be located on the integrated circuit 104 so as to obtain a magnetic coupling between the inductor L4*n* 1184*a* and the inductor L4*p* 1184*b* and the first inductor L1 1146*a* (i.e., so that a core transformer is created with L1 1146*a*, L4*n* 1184*a* and L4*p* 1184*b*). A magnetic coupling may occur between L1 1146*a*, L2 1146*b*, L3 1146*c*, L4*p* 1184*a* and L4*n* 1184*b*.

FIG. 12 is a layout example illustrating another possible layout of the first inductor L1 1146*a*, the second inductor L2 1146*b*, the third inductor L3 1146*c* and the fourth inductor L4*n* 1184*a* and L4*p* 1184*b*. The core transformer created with L1 1246*a*, L4*n* 1184*a* and L4*p* 1184*b* may have a 2:3 ratio. Thus, 2 turns may be used for L4*n*+L4*p* and 3 turns may be used for L1. The second inductor L2 1246*b* may be located within the first inductor L1 1246*a*. The second inductor L2 1246*b* may be used for low noise amplifier (LNA) 120 gate matching. The second node 1158 (i.e., the MN$_{DA}$ tap point 1258) may be located at the intersection of the first inductor L1 1246*a* and the second inductor L2 1246*b*.

The positive power amplifier (PA) differential input 1286*a* and the negative power amplifier (PA) differential input 1286*b* are shown. A power amplifier (PA) supply voltage (Vdd) 1287 is also shown. A source degeneration inductor (i.e., the third inductor L3 1246*c*) is placed around the main inductor/transformer from a source degeneration input 1268 (i.e., the fourth node 1168) to the low noise amplifier ground 1276. The antenna port 1256 (i.e., the first node 1156) is shown. The first low noise amplifier (LNA) transistor MN$_{LNA1}$ 1154 gate input 1270 (i.e., the third node 1170) is also shown.

FIG. 13 is a circuit diagram illustrating a wireless device 1302 with switching circuitry 1308 including a cascode differential power amplifier (PA) for higher transmit power and a driver amplifier (DA) for lower transmit power. The wireless device 1302 of FIG. 13 may be one configuration of the wireless device 102 of FIG. 1. The switching circuitry 1308 of FIG. 13 may be one configuration of the switching circuitry 108 of FIG. 1. The switching circuitry 1308 may be located on an integrated circuit 104 on the wireless device 102. The switching circuitry 1308 may include a power amplifier (PA) with matching circuitry and a low noise amplifier (LNA) 120 with matching circuitry.

The wireless device 1302 may include a diplexer 1310 coupled to an antenna 1312. The diplexer 1310 may also be coupled to a first DC$_{block}$ capacitor 1344*a*. In one configuration, the first DC$_{block}$ capacitor 1344*a* may be a discrete component that is not part of the switching circuitry 1308. In another configuration, the first DCblock capacitor 1344*a* may be an integrated circuit component within the switching circuitry 1308. The first DC$_{block}$ capacitor 1344*a* may be coupled to a first node 1356 on the switching circuitry 1308.

A first inductor L1 1346*a* may be coupled to the first node 1356 and to a second node 1358. The drain of a transistor MN$_{PA}$ 1348 may be coupled to the second node 1358. The transistor MN$_{PA}$ 1348 may be either an NMOS transistor or a PMOS transistor but is illustrated herein as an NMOS transistor. The source of the transistor MN$_{PA}$ 1348 may be coupled to ground. The gate of the transistor MN$_{PA}$ 1348 may receive a power amplifier (PA) enable signal 1362 that turns the transistor MN$_{PA}$ 1348 on and off. The transistor MN$_{PA}$ 1348 may be turned on during transmit mode and turned off during receive mode.

A second inductor L2 1346*b* may be coupled to the second node 1358. The second inductor L2 may also be coupled to a third node. A transistor 1392 may be coupled between the third node 1370 and ground. The transistor 1392 may be an NMOS transistor with the source coupled to ground and the drain coupled to the third node 1370. The gate of the transistor 1392 may receive a digital pre-distortion (DPD) enable signal 1391. The transistor 1392 may ensure that the receive circuitry (i.e., the low noise amplifier (LNA) circuitry) does not degrade the linearity of the transmit circuitry when the transmit circuitry is in digital pre-distortion (DPD) mode. The gate of a first low noise amplifier (LNA) transistor MN$_{LNA1}$ 1354 may be coupled to the third node 1370. In one configuration, the first low noise amplifier (LNA) transistor MN$_{LNA1}$ 1354 may be an NMOS transistor.

The source of the first low noise amplifier (LNA) transistor MN$_{LNA1}$ 1354 may be coupled to a fourth node 1368. A third inductor L3 1346*c* may be coupled to the fourth node 1368 and to a low noise amplifier (LNA) ground 1376. The drain of the first low noise amplifier (LNA) transistor MN$_{LNA1}$ 1354 may be coupled to a fifth node 1366. The source of a second low noise amplifier (LNA) transistor MN$_{LNA2}$ 1352 may be coupled to the fifth node 1366. The second low noise amplifier (LNA) transistor MN$_{LNA2}$ 1352 may be turned on and off via a control signal 1364 applied to the gate of the second low noise amplifier (LNA) transistor $MN_{LNA2}$ 1352. The drain of the second low noise amplifier (LNA) transistor $MN_{LNA2}$ 1352 may be coupled to a transformer 1379. The transformer 1379 may include a magnetic coupling 1356 between two inductors. The transformer 1379 may then be coupled to a mixer 1322.

The switching circuitry 1308 may include an inductor L4n 1384a and an inductor L4p 1384b that are each coupled to a source voltage. The inductor L4n 1384a may be coupled to the drain of a transistor $MN_{PAp}$ 1350a. In one configuration, the transistor $MN_{PAp}$ 1350a may be an NMOS transistor. The source of the transistor $MN_{PAp}$ 1350a may be coupled to the drain of a first differential input transistor 1353a. The first differential input transistor 1353a may be an NMOS transistor. The source of the first differential input transistor 1353a may be coupled to ground. The gate of the first differential input transistor 1353a may receive a positive power amplifier (PA) differential input 1386a.

The inductor L4p 1384b may be coupled to the drain of a transistor $MN_{PAn}$ 1350b. In one configuration, the transistor $MN_{PAn}$ 1350b may be an NMOS transistor. The source of the transistor $MN_{PAn}$ 1350b may be coupled to the drain of a second differential input transistor 1353b. The second differential input transistor 1353b may be an NMOS transistor. The source of the second differential input transistor 1353b may be coupled to ground. The gate of the second differential input transistor 1353b may receive a negative power amplifier (PA) differential input 1386b. The inductor L4n 1384a and the inductor L4p 1384b may be located on the integrated circuit 104 so as to obtain a magnetic coupling between the inductor L4n 1384a, the inductor L4p 1384b and the first inductor L1 1346a (i.e., so that a core transformer is created with L1 1346a, L4n 1384a and L4p 1384b). A magnetic coupling may occur between L1 1346a, L2 1346b, L3 1346c, L4p 1384b and L4n 1384a.

The wireless device 1302 may be used for transmitting and receiving both high power and low power signals. One example of a low power signal is a Bluetooth signal. One example of a high power signal is a wireless local area network (WLAN) signals. The switching circuitry 1308 may include driver amplifier (DA) circuitry 1391. The driver amplifier (DA) circuitry 1391 may be coupled to the first node 1356. The driver amplifier (DA) circuitry 1391 may include a first capacitor 1394a coupled to the first node 1356. The first capacitor 1394a may also be coupled to the source of a first NMOS transistor 1393a. The drain of the first NMOS transistor 1393a may be coupled to the source of a second NMOS transistor 1393b. The drain of the second NMOS transistor 1393b may be coupled to a second capacitor 1394b. The second capacitor 1394b may be coupled to the output of a driver amplifier (DA) 1342. The output of the driver amplifier (DA) 1342 may be coupled to a third capacitor 1394d. The third capacitor 1394d may be coupled to the drain of a third NMOS transistor 1393d. The source of the third NMOS transistor 1393d may be coupled to the drain of a fourth NMOS transistor 1393c. The source of the fourth NMOS transistor 1393c may be coupled to a fourth capacitor 1394c. The fourth capacitor 1394c may be coupled to the first node 1356. The additional circuitry added to the switching circuitry 1308 (i.e., the driver amplifier (DA) circuitry 1391) may allow the switching circuitry 1308 to generate lower output power.

Figure 14:
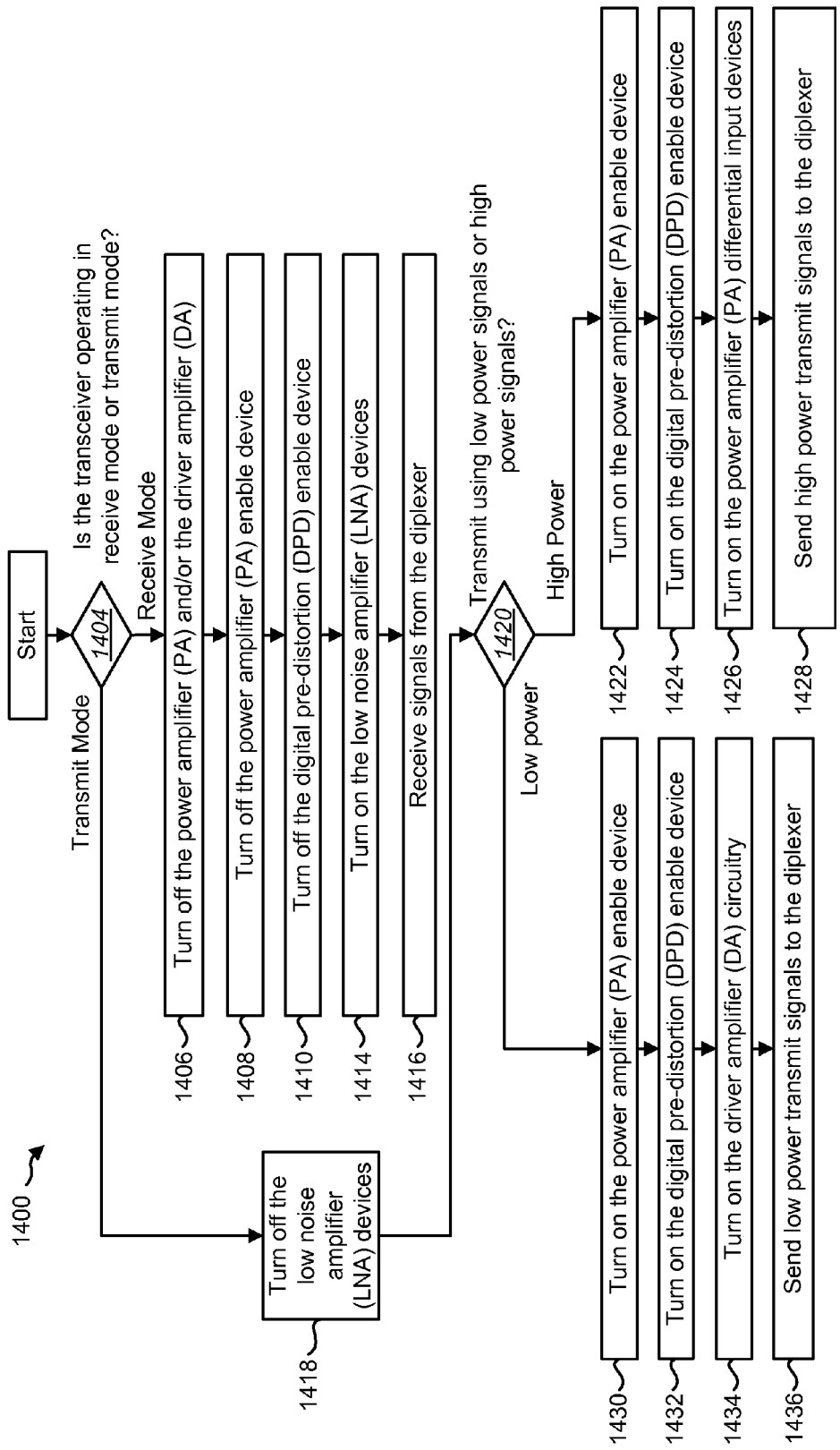
FIG. 14 is a flow diagram of another method for switching between transmit mode and receive mode using combined matching circuitry on an integrated circuit.

FIG. 14 is a flow diagram of another method 1400 for switching between transmit mode and receive mode using combined matching circuitry 114 on an integrated circuit 104. The method 1400 may be performed by a wireless device 1302. The wireless device 1302 may include a transceiver 106. The wireless device 1302 may first determine 1404 whether the transceiver 106 is operating in receive mode or transmit mode.

If the transceiver 106 is operating in receive mode, the same configuration may be used for receiving high power and low power signals. The wireless device 1302 may turn off 1406 the power amplifier (PA) and/or the driver amplifier. The power amplifier (PA) may include the transistor $MN_{PAp}$ 1350a, the transistor $MN_{PAn}$ 1350b, the first differential input transistor 1353a and the second differential input transistor 1353b. The driver amplifier (DA) may include driver amplifier (DA) circuitry 1391. The wireless device 1302 may also turn off 1408 the power amplifier (PA) enable device (i.e., the transistor $MN_{PA}$ 1348). The wireless device 1302 may turn off 1410 the digital pre-distortion (DPD) enable device (i.e., the transistor 1392). The wireless device 1302 may turn off 1412 the driver amplifier (DA) circuitry 1391.

The wireless device 1302 may turn on 1414 the low noise amplifier (LNA) 120 devices. The low noise amplifier (LNA) 120 devices may include those devices associated with the low noise amplifier (LNA) 120. For example, the low noise amplifier (LNA) 120 devices may include the first low noise amplifier (LNA) transistor $MN_{LNA1}$ 1354, the second low noise amplifier (LNA) transistor $MN_{LNA2}$ 1352 and the transformer 1379. The wireless device 1302 may then receive 1416 signals from the diplexer 110. The signals may be either high power or low power signals. For example, the received signals may be wireless local area network (WLAN) signals or Bluetooth signals.

If the transceiver 106 is operating in transmit mode, the wireless device 1302 may turn off 1418 the low noise amplifier (LNA) 120 devices (i.e., the first low noise amplifier (LNA) transistor $MN_{LNA1}$ 1354, the second low noise amplifier (LNA) transistor $MN_{LNA2}$ 1352 and the transformer 1379). The wireless device 1302 may then determine 1420 whether the transceiver 106 is transmitting using low power signals or high power signals.

If the transceiver 106 is transmitting using low power signals, the wireless device 1302 may turn on 1430 the power amplifier (PA) enable device (i.e., the transistor $MN_{PA}$ 1348). The wireless device 1302 may also turn on 1432 the digital pre-distortion (DPD) transistor (i.e., the transistor 1392). The wireless device 1302 may further turn on 1434 the driver amplifier (DA) circuitry 1391. The wireless device 1302 may then send 1436 low power transmit signals to the diplexer 110.

If the transceiver 106 is transmitting using high power signals, the wireless device 1302 may turn on 1422 the power amplifier (PA) enable device (i.e., the transistor $MN_{PA}$ 1348). The wireless device 1302 may also turn on 1424 the digital pre-distortion (DPD) enable transistor 1392. The wireless device 1302 may further turn on 1426 the power amplifier (PA) differential input devices (i.e., the first differential input transistor 1353a, the second differential input transistor 1353b, the transistor $MN_{PAn}$ 1350b and the transistor $MN_{PAp}$ 1350a). The wireless device 1302 may then send 1428 high power signals to the diplexer 110.

Figure 15:
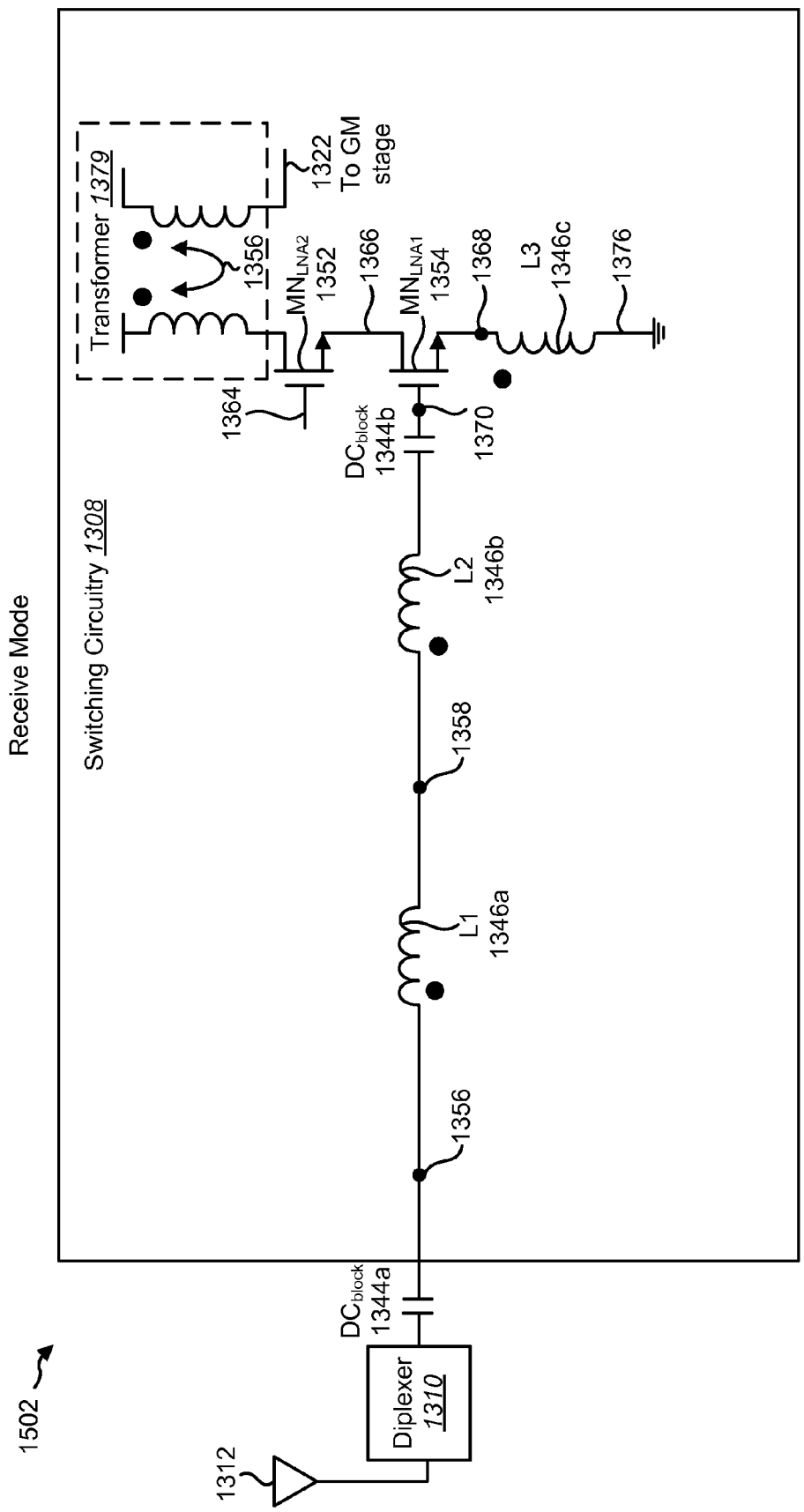
FIG. 15 is a circuit diagram illustrating a wireless device with switching circuitry for both high power and low power signals that is operating in receive mode.

FIG. 15 is a circuit diagram illustrating a wireless device 1502 with switching circuitry 1308 for both high power and low power signals that is operating in receive mode. The switching circuitry 1308 of FIG. 15 may be the switching circuitry 1308 of FIG. 13. The wireless device 1502 may be operating in receive mode if a transceiver 106 on the wireless device 1502 is operating in receive mode. In FIG. 15, the driver amplifier (DA) circuitry 1391, the power amplifier (PA) differential input devices, the power amplifier (PA)

enable device and the digital pre-distortion (DPD) transistor 1392 have all been turned off and are thus not illustrated.

The first inductor L1 1346a and the second inductor L2 1346b may be connected in series to form a gate matching inductor for the low noise amplifier (LNA) 120. The gate matching inductor may form part of a conventional source degeneration matching low noise amplifier (LNA) 120.

Figure 16:
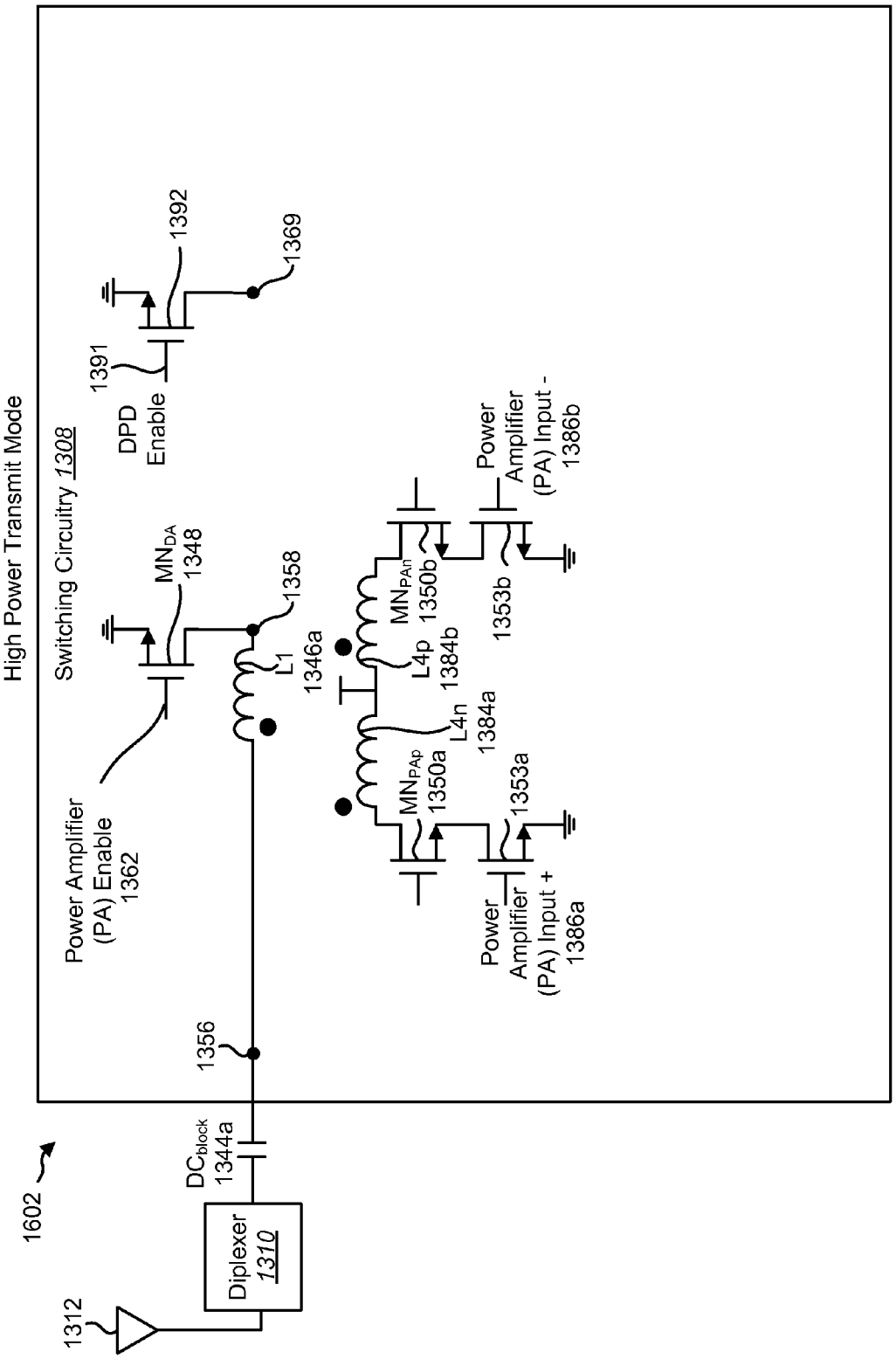
FIG. 16 is a circuit diagram illustrating a wireless device with switching circuitry for both high power and low power signals that is operating in high power transmit mode.

FIG. 16 is a circuit diagram illustrating a wireless device 1602 with switching circuitry 1308 for both high power and low power signals that is operating in high power transmit mode. The switching circuitry 1308 of FIG. 16 may be the switching circuitry 1308 of FIG. 13. The wireless device 1602 may be operating in high power transmit mode if a transceiver 106 on the wireless device 1302 is operating in high power transmit mode. In FIG. 16, the low noise amplifier (LNA) 120 circuitry and the driver amplifier (DA) circuitry 1391 have been turned off and thus are not illustrated.

The transistor $MN_{PA}$ 1348 may operate in the triode region and have no direct current (DC) voltage drop across it. Thus, the second node 1358 may ideally be alternating current (AC) grounded. The output of the power amplifier (PA) (i.e., the first node 1356) is directly at the diplexer 1310 input (via the first $DC_{block}$ capacitor 1344a). Thus, no additional loss is incurred, saving power.

Figure 17:
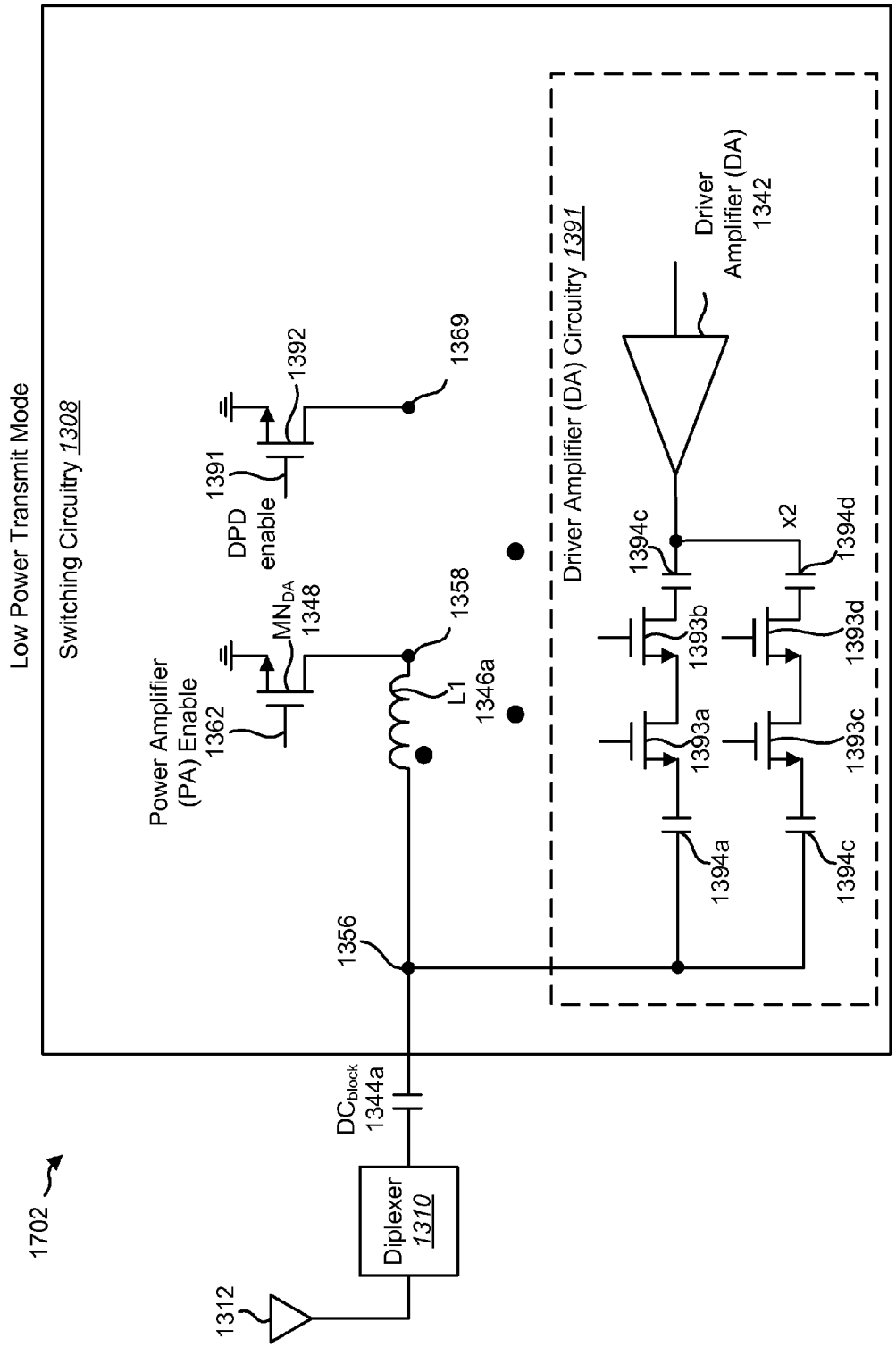
FIG. 17 is a circuit diagram illustrating a wireless device with switching circuitry for both high power and low power signals that is operating in low power transmit mode.

FIG. 17 is a circuit diagram illustrating a wireless device 1702 with switching circuitry 1308 for both high power and low power signals that is operating in low power transmit mode. The switching circuitry 1308 of FIG. 17 may be the switching circuitry 1308 of FIG. 13. The wireless device 1702 may be operating in low power transmit mode if a transceiver 106 on the wireless device 1702 is operating in low power transmit mode. In FIG. 17, the low noise amplifier (LNA) 120 circuitry (i.e., the first low noise amplifier (LNA) transistor $MN_{LNA1}$ 1354, the second low noise amplifier (LNA) transistor $MN_{LNA2}$ 1352 and the transformer 1379) and the differential power amplifier (PA) circuitry (i.e., the transistor $MN_{PAp}$ 1350a, the transistor $MN_{PAn}$ 1350b, the first differential input transistor 1353a and the second differential input transistor 1353b) have been turned off and thus are not illustrated. The driver amplifier (DA) circuitry 1391 may provide a lower output power that is necessary for transmitting low power transmit signals.

Figure 18:
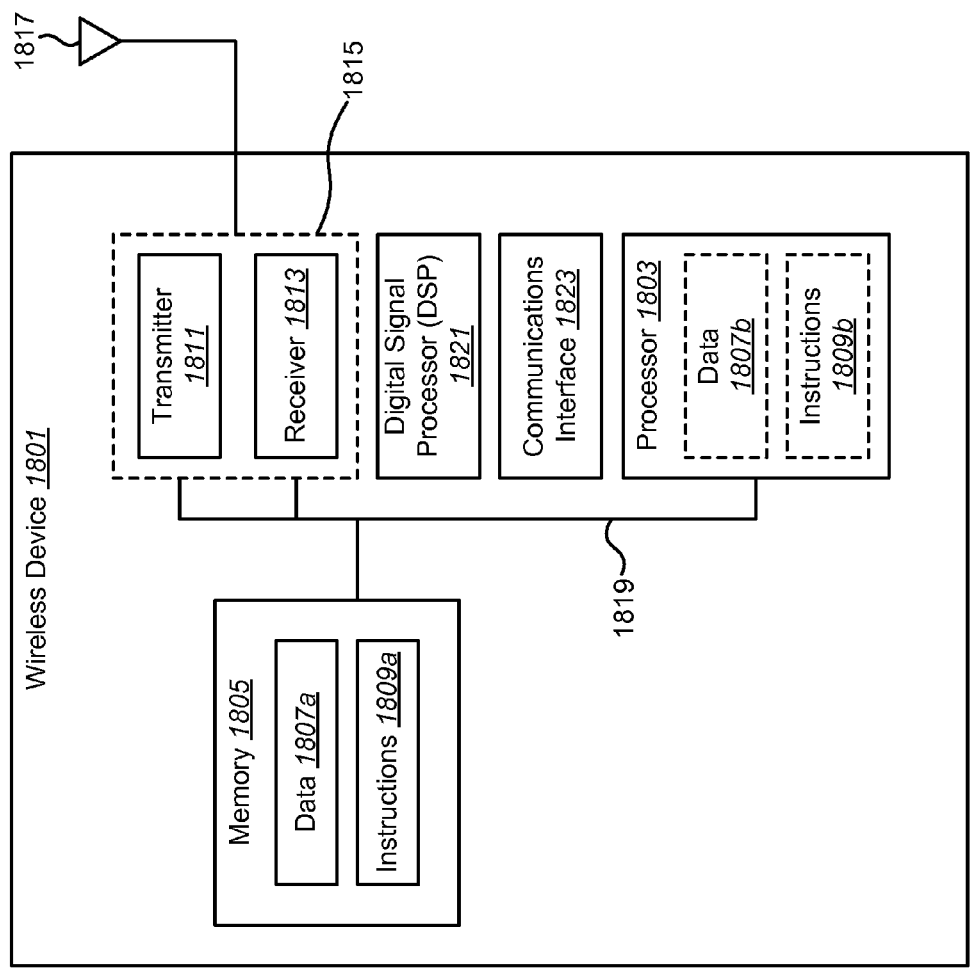
FIG. 18 illustrates certain components that may be included within a wireless device.

FIG. 18 illustrates certain components that may be included within a wireless device 1801. The wireless device 1801 may be an access terminal, a mobile station, a user equipment (UE), a base station, a node B, an evolved Node B, etc. The wireless device 1801 includes a processor 1803. The processor 1803 may be a general purpose single- or multi-chip microprocessor (e.g., an ARM), a special purpose microprocessor (e.g., a digital signal processor (DSP)), a microcontroller, a programmable gate array, etc. The processor 1803 may be referred to as a central processing unit (CPU). Although just a single processor 1803 is shown in the wireless device 1801 of FIG. 18, in an alternative configuration, a combination of processors (e.g., an ARM and DSP) could be used.

The wireless device 1801 also includes memory 1805. The memory 1805 may be any electronic component capable of storing electronic information. The memory 1805 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 1807a and instructions 1809a may be stored in the memory 1805. The instructions 1809a may be executable by the processor 1803 to implement the methods disclosed herein. Executing the instructions 1809a may involve the use of the data 1807a that is stored in the memory 1805. When the processor 1803 executes the instructions 1809a, various portions of the instructions 1809b may be loaded onto the processor 1803, and various pieces of data 1807b may be loaded onto the processor 1803.

The wireless device 1801 may also include a transmitter 1811 and a receiver 1813 to allow transmission and reception of signals to and from the wireless communication device 1801. The transmitter 1811 and receiver 1813 may be collectively referred to as a transceiver 1815. An antenna 1817 may be electrically coupled to the transceiver 1815. The wireless device 1801 may also include (not shown) multiple transmitters, multiple receivers, multiple transceivers and/or multiple antenna. The wireless device 1801 may further include a digital signal processor (DSP) 1821 and a communications interface 1823.

The various components of the wireless device 1801 may be coupled together by one or more buses, which may include a power bus, a control signal bus, a status signal bus, a data bus, etc. For the sake of clarity, the various buses are illustrated in FIG. 18 as a bus system 1819.

The term "coupled" encompasses a wide variety of connections. For example, the term "coupled" should be interpreted broadly to encompass circuit elements directly connected to each other and circuit elements indirectly connected via other circuit elements.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 3 and 14, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An integrated circuit for transmit and receive matching, the integrated circuit comprising:
    a transmit amplifier comprising:
        a first transistor;
        a second transistor; and
        a first inductor, wherein the first inductor couples the first transistor to the second transistor;
    a low noise amplifier comprising:
        a third transistor;
        a fourth transistor;
        the first inductor;
        a second inductor, wherein the second inductor couples the first inductor to the third transistor;
        a third inductor, wherein the third inductor couples the third transistor to ground; and
        a transformer.

2. The integrated circuit of claim 1, wherein the transmit amplifier is a driver amplifier, wherein the first transistor is an n-type transistor, wherein the second transistor is a p-type transistor, and wherein a driver amplifier input is coupled to a gate of the first transistor.

3. The integrated circuit of claim 1, wherein the transmit amplifier is a driver amplifier, wherein the first transistor is a p-type transistor, wherein the second transistor is an n-type transistor, and wherein a driver amplifier input is coupled to a gate of the first transistor.

4. The integrated circuit of claim 2, wherein a drain of the first transistor is coupled to a first node, wherein the first inductor is coupled between the first node and a second node, and wherein a source of the second transistor is coupled to the second node.

5. The integrated circuit of claim 1, wherein the third transistor is an n-type transistor, wherein the fourth transistor is an n-type transistor, wherein the third inductor is coupled to a source of the third transistor, wherein a drain of the third transistor is coupled to a source of the fourth transistor, and wherein a drain of the fourth transistor is coupled to the transformer.

6. The integrated circuit of claim 1, wherein the first transistor and the second transistor are turned off during receive mode, and wherein the third transistor and the fourth transistor are turned off during transmit mode.

7. The integrated circuit of claim 1, wherein a magnetic coupling occurs between the first inductor, the second inductor and the third inductor.

8. The integrated circuit of claim 1, wherein the first inductor, the second inductor and the third inductor are part of combined matching circuitry.

9. The integrated circuit of claim 1, further comprising a $2^{nd}$ harmonic trap.

10. The integrated circuit of claim 1, wherein the transmit amplifier is a power amplifier, and wherein the transmit amplifier further comprises a fourth inductor coupled to the first transistor, wherein the coupling between the first transistor and the second transistor is a magnetic coupling between the first inductor and the fourth inductor.

11. The integrated circuit of claim 1, wherein the first inductor is coupled to a first node, and wherein the first node is coupled to a diplexer.

12. The integrated circuit of claim 11, further comprising:
    a first direct current blocking capacitor coupled between the first node and the diplexer; and
    a second direct current blocking capacitor coupled between the third inductor and a gate of the third transistor.

13. The integrated circuit of claim 10, further comprising:
a fifth inductor; and
a fifth transistor, wherein the first inductor and the fifth inductor form a magnetic coupling between the fifth transistor and the second transistor.

14. The integrated circuit of claim 13, wherein a gate of the first transistor is coupled to a first differential power amplifier input, and wherein a gate of the fifth transistor is coupled to a second differential power amplifier input.

15. The integrated circuit of claim 13, further comprising:
a capacitor; and
a sixth transistor, wherein the capacitor is coupled between the first inductor and the sixth transistor.

16. The integrated circuit of claim 14, wherein the first inductor is coupled to a first node, wherein the first node is coupled to a diplexer, wherein the transmit amplifier further comprises a sixth transistor and a seventh transistor, wherein the sixth transistor is coupled between the first transistor and the fourth inductor to form a first cascode device, wherein the seventh transistor is coupled between the fifth transistor and the fifth inductor to form a second cascode device, and further comprising a driver amplifier circuitry coupled to the first node, wherein the driver amplifier circuitry comprises a driver amplifier and circuitry to switch a coupling between the driver amplifier and the first node on and off.

17. The integrated circuit of claim 16, wherein the circuitry to switch the coupling between the driver amplifier and the first node is on during a low power transmit mode and off otherwise.

18. The integrated circuit of claim 16, wherein during a high power transmit mode the driver amplifier circuitry, the third transistor and the fourth transistor are turned off, and wherein the first transistor, the second transistor and the sixth transistor are turned on.

19. A method for switching between transmit mode and receive mode on an integrated circuit, the method comprising:
switching to operating in transmit mode;
turning on transmit amplifier devices, wherein the transmit amplifier devices comprise:
a first transistor; and
a second transistor, wherein a first inductor couples the first transistor to the second transistor;
turning off low noise amplifier devices, wherein the low noise amplifier devices comprise:
a third transistor, wherein a second inductor couples the first inductor to the third transistor, and wherein a third inductor couples the third transistor to ground; and
a fourth transistor, wherein a transformer couples the fourth transistor to a mixer;
sending transmit signals to a diplexer;
switching to operating in receive mode;
turning on the low noise amplifier devices,
turning off the transmit amplifier devices; and
receiving signals from the diplexer.

20. The method of claim 19, wherein the transmit amplifier devices form a driver amplifier, wherein the first transistor is an n-type transistor, wherein the second transistor is a p-type transistor, and wherein a driver amplifier input is coupled to a gate of the first transistor.

21. The method of claim 19, wherein the transmit amplifier devices form a driver amplifier, wherein the first transistor is a p-type transistor, wherein the second transistor is an n-type transistor, and wherein a driver amplifier input is coupled to a gate of the second transistor.

22. The method of claim 20, wherein a drain of the first transistor is coupled to a first node, wherein the first inductor is coupled between the first node and a second node, and wherein a source of the second transistor is coupled to the second node.

23. The method of claim 19, wherein the third transistor is an n-type transistor, wherein the fourth transistor is an n-type transistor, wherein the third inductor is coupled to a source of the third transistor, wherein a drain of the third transistor is coupled to a source of the fourth transistor, and wherein a drain of the fourth transistor is coupled to the transformer.

24. The method of claim 19, wherein a magnetic coupling occurs between the first inductor, the second inductor and the third inductor.

25. The method of claim 19, wherein the first inductor, the second inductor and the third inductor are part of combined matching circuitry.

26. The method of claim 19, wherein the transmit amplifier devices further comprise a $2^{nd}$ harmonic trap.

27. The method of claim 19, wherein the transmit amplifier devices form a power amplifier, and wherein the transmit amplifier devices further comprise a fourth inductor, wherein the first inductor couples the first transistor to the second transistor via a magnetic coupling between the first inductor and the fourth inductor, and wherein the fourth inductor is coupled between a drain of the first transistor and a source voltage.

28. The method of claim 19, wherein the first inductor is coupled to a first node, and wherein the first node is coupled to the diplexer.

29. The method of claim 28, wherein the integrated circuit comprises:
a first direct current blocking capacitor coupled between the first node and the diplexer; and
a second direct current blocking capacitor coupled between the third inductor and a gate of the third transistor.

30. The method of claim 27, wherein the transmit amplifier devices further comprise:
a fifth inductor; and
a fifth transistor, wherein the first inductor and the fifth inductor form a magnetic coupling between the fifth transistor and the second transistor.

31. The method of claim 30, wherein a gate of the first transistor is coupled to a first differential power amplifier input, and wherein a gate of the fifth transistor is coupled to a second differential power amplifier input.

32. The method of claim 30, wherein the transmit amplifier devices further comprise a sixth transistor, wherein a capacitor is coupled between the first inductor and the sixth transistor.

33. The method of claim 31, wherein the first inductor is coupled to a first node, wherein the first node is coupled to a diplexer, wherein the transmit amplifier further comprises a sixth transistor and a seventh transistor, wherein the sixth transistor is coupled between the first transistor and the fourth inductor to form a first cascode device, wherein the seventh transistor is coupled between the fifth transistor and the fifth inductor to form a second cascode device, and further comprising turning on a driver amplifier circuitry coupled to the first node, wherein the driver amplifier circuitry comprises a driver amplifier and circuitry to switch a coupling between the driver amplifier and the first node on and off.

34. The method of claim 33, wherein the circuitry to switch the coupling between the driver amplifier and the first node is on during a low power transmit mode and off otherwise.

35. The method of claim 33, wherein during a high power transmit mode the driver amplifier circuitry, the third transistor and the fourth transistor are turned off, and wherein the first transistor, the second transistor and the sixth transistor are turned on.

36. An apparatus for switching between transmit mode and receive mode, comprising:
- means for switching to operating in transmit mode;
- means for turning on transmit amplifier devices, wherein the transmit amplifier devices comprise:
  - a first transistor; and
  - a second transistor, wherein a first inductor couples the first transistor to the second transistor;
- means for turning off low noise amplifier devices, wherein the low noise amplifier devices comprise:
  - a third transistor, wherein a second inductor couples the first inductor to the third transistor, and wherein a third inductor couples the third transistor to ground; and
  - a fourth transistor, wherein a transformer couples the fourth transistor to a mixer;
- means for sending transmit signals to a diplexer;
- means for switching to operating in receive mode;
- means for turning on the low noise amplifier devices,
- means for turning off the transmit amplifier devices; and
- means for receiving signals from the diplexer.

37. A computer-program product for a wireless device configured for switching between transmit mode and receive mode, the computer-program product comprising a non-transitory computer-readable medium having instructions thereon, the instructions comprising:
- code for causing a wireless device to switch to operating in transmit mode;
- code for causing the wireless device to turn on transmit amplifier devices, wherein the transmit amplifier devices comprise:
  - a first transistor; and
  - a second transistor, wherein a first inductor couples the first transistor to the second transistor;
- code for causing the wireless device to turn off low noise amplifier devices, wherein the low noise amplifier devices comprise:
  - a third transistor, wherein a second inductor couples the first inductor to the third transistor, and wherein a third inductor couples the third transistor to ground; and
  - a fourth transistor, wherein a transformer couples the fourth transistor to a mixer;
- code for causing the wireless device to send transmit signals to a diplexer;
- code for causing the wireless device to switch to operating in receive mode;
- code for causing the wireless device to turn on the low noise amplifier devices,
- code for causing the wireless device to turn off the transmit amplifier devices; and
- code for causing the wireless device to receive signals from the diplexer.

* * * * *